United States Patent
Kim et al.

(10) Patent No.: US 7,704,867 B2
(45) Date of Patent: Apr. 27, 2010

(54) METHOD OF MANUFACTURING SEMICONDUCTOR DEVICES

(75) Inventors: Weon-Hong Kim, Suwon-si (KR);
Min-Woo Song, Seongnam-si (KR);
Pan-Kwi Park, Suwon-si (KR);
Jung-Min Park, Ansan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/401,305

(22) Filed: Mar. 10, 2009

(65) Prior Publication Data

US 2009/0233434 A1    Sep. 17, 2009

(51) Int. Cl.
*H01L 21/3205* (2006.01)
*H01L 21/4763* (2006.01)

(52) U.S. Cl. .............. 438/594; 257/298; 257/300; 257/303

(58) Field of Classification Search .............. None
See application file for complete search history.

(56) References Cited

U.S. PATENT DOCUMENTS

2002/0190294 A1* 12/2002 Iizuka et al. ................ 257/296
2004/0217478 A1* 11/2004 Yamamoto et al. .......... 257/758
2006/0216947 A1* 9/2006 Choi et al. .................. 438/763
2007/0049021 A1* 3/2007 Basceri et al. .............. 438/680
2008/0157279 A1* 7/2008 Horikawa ................... 257/534

FOREIGN PATENT DOCUMENTS

KR    1020050005726    1/2005
KR    1020050050003    5/2005

OTHER PUBLICATIONS

Nieh, R.E., et al., "Electrical characterization and material evaluation of zirconium oxynitride gate dielectric in TaN-gated NMOSFETs with high-temperature forming gas annealing", Electron Devices, IEEE Transactions, vol. 50, Issue 2, Feb. 2003.

* cited by examiner

*Primary Examiner*—Ha Tran T Nguyen
*Assistant Examiner*—Shantanu C Pathak
(74) *Attorney, Agent, or Firm*—F. Chau & Associates, LLC

(57) ABSTRACT

In semiconductor devices and methods of manufacturing semiconductor devices, a zirconium source having zirconium, carbon and nitrogen is provided onto a substrate to form an adsorption layer of the zirconium source on the substrate. A first purging process is performed to remove a non-adsorbed portion of the zirconium source. An oxidizing gas is provided onto the adsorption layer to form an oxidized adsorption layer of the zirconium source on the substrate. A second purging process is performed to remove a non-reacted portion of the oxidizing gas. A nitriding gas is provided on the oxidized adsorption layer to form a zirconium carbo-oxynitride layer on the substrate, and a third purging process is provided to remove a non-reacted portion of the nitriding gas.

16 Claims, 24 Drawing Sheets

METHOD OF MANUFACTURING SEMICONDUCTOR DEVICES

CROSS-REFERENCE TO RELATED APPLICATIONS

This application claims priority under 35 USC §119 to Korean Patent Application No. 2008-23059, filed on Mar. 12, 2008, the contents of which are hereby incorporated by reference in their entirety.

BACKGROUND

1. Technical Field

Example embodiments relate to semiconductor devices having a dielectric layer of a high dielectric constant and to a method of manufacturing semiconductor devices.

2. Description of the Related Art

As a result of semiconductor devices becoming more highly integrated, the area of a unit cell has been significantly reduced, and also the operational voltage has been lowered as well. Accordingly, a dielectric layer having a high dielectric constant (high-k) has been applied to the semiconductor devices to enhance electrical storage performance and/or to suppress leakage current through the dielectric layer.

Generally, a high-k dielectric layer has a thin equivalent oxide thickness and a high dielectric constant, so the high-k dielectric layer may improve the capacitance of a capacitor or a coupling ratio of a flash memory device, or the high-k dielectric layer may provide a proper threshold voltage of a metal gate structure.

For example, a hafnium oxide ($HfO_2$) layer, a tantalum oxide ($Ta_2O_5$) layer or an aluminum oxide ($Al_2O_3$) layer have been used as the high-k dielectric layer. These dielectric layers have a high dielectric constant of about 20, so these dielectric layers may have an electrically effective thickness. However, these dielectric layers may be crystallized during a subsequent annealing process. When crystallization of a dielectric layer occurs, a threshold voltage of a gate may not be uniform along a channel length, and a leakage current deteriorating reliability of a semiconductor device may be generated.

Zirconium oxide ($ZrO_2$) has a high dielectric constant of at least about 40, so recently zirconium oxide has been widely used as a dielectric layer. However, a zirconium oxide layer may have some difficulties with regard to deteriorating characteristics of a semiconductor device. For instance, the zirconium oxide layer may be readily thickened while other processes are performed. In addition, the zirconium oxide layer may be readily crystallized during a subsequent thermal process, so leakage current of a semiconductor device may be generated through a crystallized portion of the zirconium oxide layer.

FIG. 1 is a graph illustrating a failed bit count (FBC) according to variation of applied voltage (Vp) in a memory device having a zirconium oxide ($ZrO_2$) dielectric layer. Referring to FIG. 1, the number of failed bit per unit cell rapidly increased at about 0.6V, and increased at about 1V largely over about 10 bit, which may be a maximum allowable number of failed bits. These results may indicate that leakage current paths may be generated in the zirconium oxide layer while amorphous zirconium oxide of the dielectric layer may be partially or fully crystallized by heat. Therefore, when a zirconium oxide dielectric layer is used, an increase in temperature in a thermal process may be limited. Therefore, the formation of a dielectric layer having enhanced thermal stability and electrical characteristics, e.g. a uniform threshold voltage in a channel region and a constant operational voltage, is still required in the art.

SUMMARY

Example embodiments may provide methods of manufacturing the semiconductor device including a high dielectric layer, which may have a high dielectric constant and reduce generation of a leakage current through a crystallization portion of the dielectric layer.

Example embodiments may also provide semiconductor devices including a high dielectric layer, which may have a high dielectric constant and reduce generation of a leakage current through a crystallization portion of the dielectric layer.

In accordance with an exemplary embodiment of the present invention, a method of manufacturing a semiconductor device is provided. The method includes providing a zirconium source having zirconium, carbon and nitrogen onto a semiconductor substrate to form an adsorption layer of the zirconium source on the semiconductor substrate, performing a first purging process to remove a non-adsorbed portion of the zirconium source from the semiconductor substrate, providing an oxidizing gas onto the adsorption layer of the zirconium source to form an oxidized adsorption layer of the zirconium source on the semiconductor substrate and performing a second purging process to remove a non-reacted portion of the oxidizing gas. The method further includes providing a nitriding gas on the oxidized adsorption layer of the zirconium source to form a zirconium carbo-oxynitride layer on the semiconductor substrate, and then performing a third purging process to remove a non-reacted portion of the nitriding gas.

An example of the zirconium source may include but is not limited to tetrakis(dialkylamino)zirconium. Examples of the oxidizing gas may include but are not limited to oxygen ($O_2$), ozone ($O_3$), water vapor ($H_2O$), etc. Examples of the nitriding gas may include ammonia ($NH_3$), nitrous oxide ($N_2O$), nitric oxide (NO), etc. The nitriding gas may be activated by plasma.

In example embodiments, the steps from providing the zirconium source through performing the third purging process may be repeated in a cycle.

In example embodiments, at least two cycles may be performed, and at least two layers of zirconium carbo-oxynitride having different amounts of oxygen, carbon and/or nitrogen from each other may be formed on the semiconductor substrate. In some embodiments, the at least two cycles may use different types, feed amounts and/or pressure levels of the oxidizing gas and/or the nitriding gas. In other embodiments, the at least two cycles may have a repeat unit including at least two cycles each of which uses different types, feed amounts and/or pressure levels of the oxidizing gas and/or the nitriding gas.

In example embodiments, a lower electrode may be formed on the semiconductor substrate before providing the zirconium source onto the semiconductor substrate, and an upper electrode may be formed on the zirconium carbo-oxynitride layer after performing the third purging process.

In example embodiments, an electrode may be formed on the zirconium carbo-oxynitride layer after performing the third purging process.

In example embodiments, a tunnel oxide layer and a floating gate electrode may be sequentially formed on the semiconductor substrate before providing the zirconium source onto the semiconductor substrate. A control gate electrode may be formed on the zirconium carbo-oxynitride layer after performing the third purging process. The zirconium carbo-oxynitride layer may be provided as a dielectric layer between the floating gate electrode and the control gate electrode.

In accordance with another example embodiment, a semiconductor device is provided. The semiconductor device includes a semiconductor substrate, a dielectric layer formed on the semiconductor substrate and an electrode formed on the dielectric layer. The dielectric layer includes at least two atomic layers of zirconium carbo-oxynitride. The at least two atomic layers of zirconium carbo-oxynitride having different amounts of at least one of carbon, oxygen and nitrogen.

In example embodiments, the dielectric layer may include a plurality of atomic layers of zirconium carbo-oxynitride having a chemical formula of $ZrO_{2-x-y}C_xN_y$, in which x and y satisfy $0<x<2$, $0<y<2$ and $0<x+y<2$ and at least two of the atomic layers may have different values for at least one of x and y.

In example embodiments, the dielectric layer may include a plurality of atomic layers of zirconium carbo-oxynitride having a chemical formula of $ZrO_{2-x-y}C_xN_y$, in which x and y satisfy $0<x<2$, $0<y<2$ and $0<x+y<2$, and the plurality of atomic layers may have a repeating unit of at least two atomic layers which have different values for at least one of x and y.

In example embodiments, the semiconductor device may further include a lower electrode between the semiconductor substrate and the dielectric layer.

In example embodiments, the semiconductor device may further include a tunnel oxide layer formed on the semiconductor substrate, and a floating gate electrode on the tunnel oxide layer. The dielectric layer may be formed on the floating gate electrode, and the electrode may be provided as a control gate electrode.

According to example embodiments, the zirconium carbo-oxynitride layer formed by sequentially providing the oxidizing gas and the nitriding gas to the adsorption layer of the zirconium source may have a stable structure in which zirconium, oxygen, carbon and nitrogen may be stably combined. The zirconium carbo-oxynitride layer may have a high temperature of crystallization relative to that of a zirconium oxide layer. Thus, a generation of a leakage current through a crystallized portion may be reduced or suppressed, and a device having a uniform threshold voltage along a channel length may be obtained. Further, a temperature margin of a thermal process performed after forming the zirconium carbo-oxynitride layer may be raised.

Furthermore, the zirconium carbo-oxynitride layer may have a reduced equivalent oxide thickness (EOT) and a high dielectric constant. Therefore, a dimension of a dielectric layer in a device may be reduced, and a highly-integrated device having an increased number of cells may be manufactured.

Additionally, the zirconium carbo-oxynitride layer may be formed to have sub-layers of various compositions by an ALD process using different process conditions. Such a zirconium carbo-oxynitride layer may not be readily crystallized during a thermal process due to non-uniformity of the compositions of the sub-layers, and thus a generation of a leakage current from the dielectric layer may also be reduced. Further, the dielectric constant of the dielectric layer may be simply adjusted by changing process conditions of each cycle in an ALD process. Therefore, the zirconium carbo-oxynitride layer may be properly employed in various devices or logics. The zirconium carbo-oxynitride layer may also be applied to a dielectric layer between a floating gate and a control gate in a flash memory device to improve the coupling ratio of the flash memory device.

BRIEF DESCRIPTION OF THE DRAWINGS

Example embodiments can be understood in more detail from the following description taken in conjunction with the accompanying drawings. FIGS. 1-34 represent non-limiting, example embodiments as described herein.

FIG. 1 is a graph illustrating a failed bit count (FBC) according to variation of applied voltage (Vp) in a memory device having a zirconium oxide ($ZrO_2$) dielectric layer.

FIG. 2 is a flow chart illustrating a method of forming a zirconium carbo-oxynitride layer.

FIGS. 4 through 6 are diagrams illustrating exemplary sequences of providing reactive gases in a method of forming a zirconium carbo-oxynitride layer through an ALD process.

FIG. 7 is a graph illustrating a leakage current density (A/cell) vs. applied voltage (V) measured from capacitors having zirconium carbo-oxynitride layers formed by the methods of FIGS. 4 and 5.

FIGS. 8 through 15 are cross-sectional views illustrating a method of manufacturing a DRAM device according to an example embodiment.

FIGS. 16 through 19 are cross-sectional views illustrating a method of manufacturing a capacitor of a logic device according to an example embodiment.

FIGS. 20 through 23 are cross-sectional views illustrating a method of manufacturing a decoupling capacitor of a logic device according to an example embodiment.

FIGS. 24 through 28 are cross-sectional views illustrating a method of manufacturing a flash memory device according to an example embodiment.

FIGS. 29 through 31 are cross-sectional views illustrating a method of manufacturing a gate structure according to an example embodiment.

FIGS. 32 through 34 are block diagrams illustrating systems including a memory device in accordance with an example embodiment.

DETAILED DESCRIPTION OF THE EXAMPLE EMBODIMENTS

Figure 1:
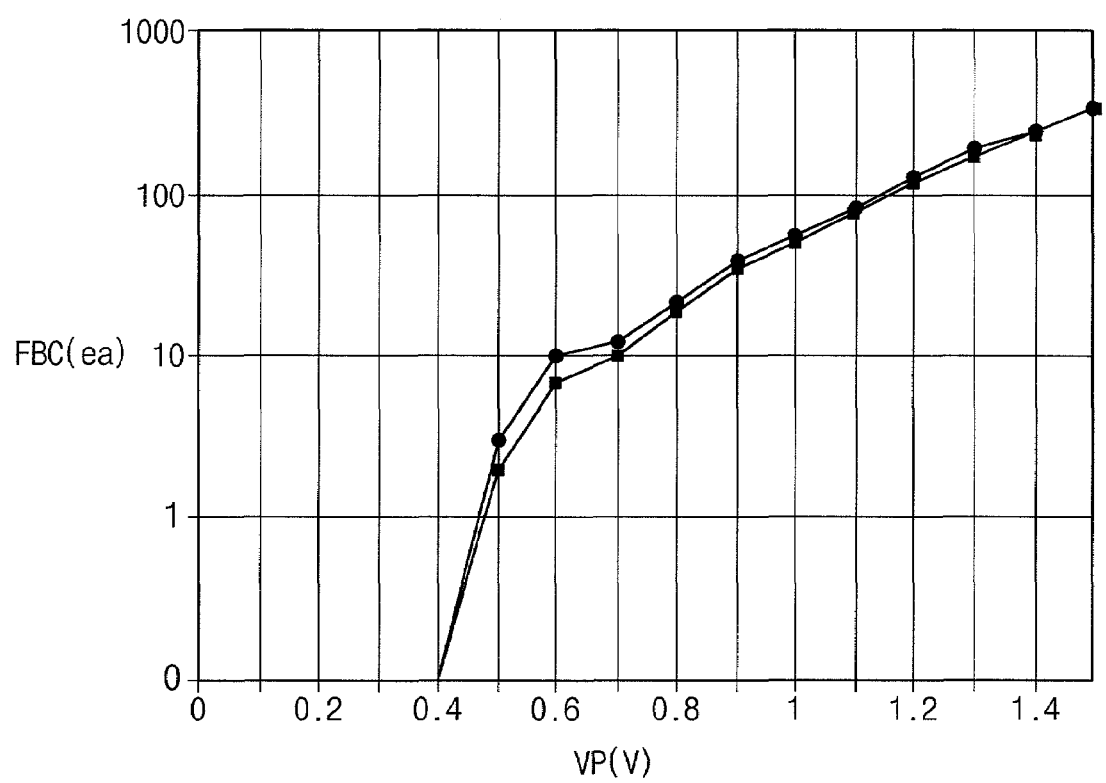

Various example embodiments will be described more fully hereinafter with reference to the accompanying drawings, in which some example embodiments are shown. Example embodiments may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Method of Forming a Zirconium Carbo-Oxynitride Layer

Example embodiments provide methods of forming a zirconium carbo-oxynitride layer. The zirconium carbo-oxynitride layer may have a high dielectric constant of, for example, at least about 40 which may be similar to that of zirconium oxide. The zirconium carbo-oxynitride layer may also have a high temperature of crystallization relative to zirconium oxide, so a dielectric layer having zirconium carbo-oxynitride may reduce or suppress generation of leakage current through a crystallized portion.

According to example embodiments, the zirconium carbo-oxynitride layer may be formed by, for example, performing a sequence of several steps through an atomic layer deposition (ALD) process or a plasma enhanced ALD (PEALD) process. The zirconium carbo-oxynitride layer, which is prepared using a sequence of using reactive gases as described in the follow example embodiments, may have significantly improved electrical characteristics, e.g. a high dielectric constant and a thin equivalent oxide thickness (EOT), as compared with using other sequence of reactive gases.

Figure 2:
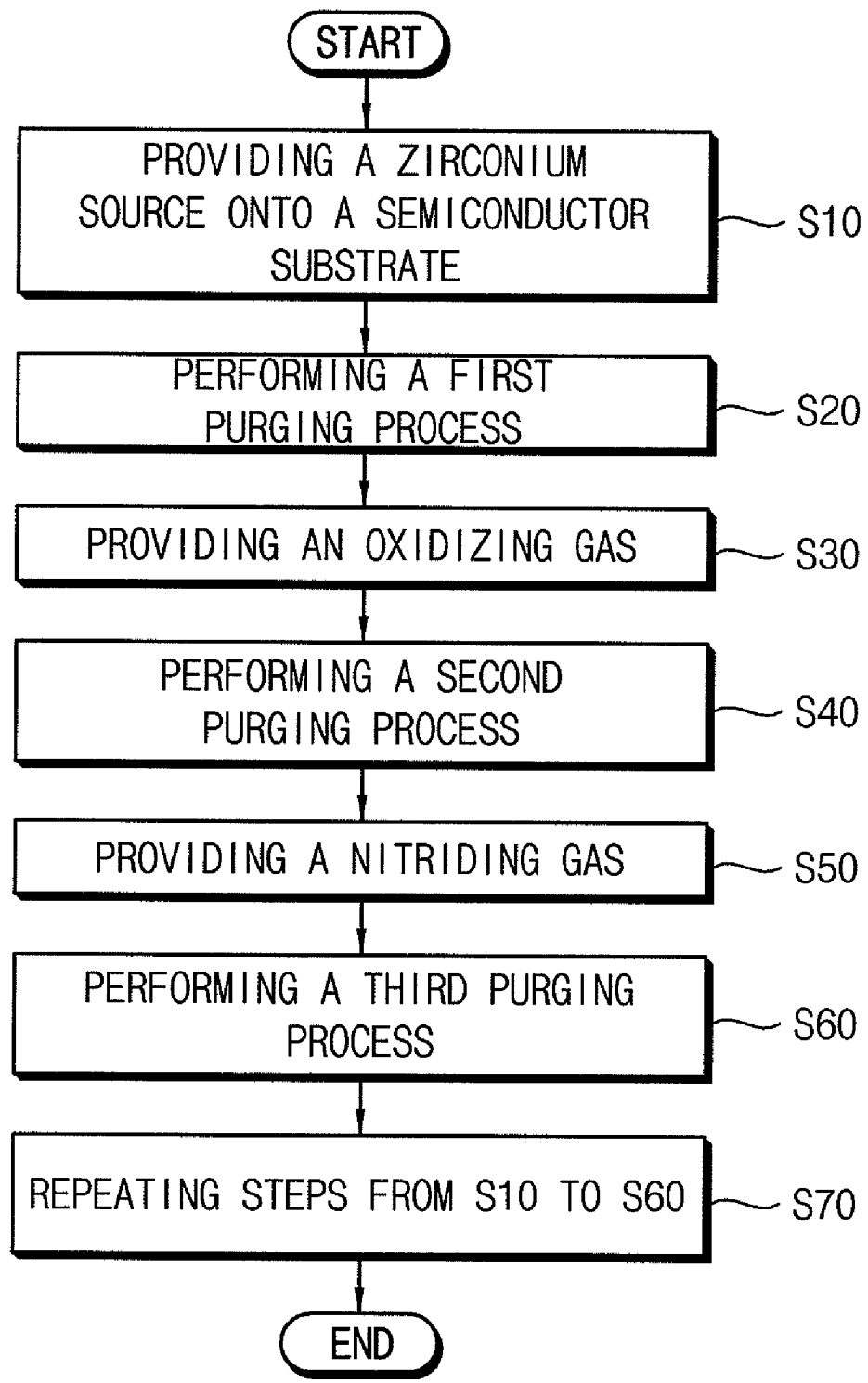

FIG. 2 is a flow chart illustrating a method of forming a zirconium carbo-oxynitride layer. Referring to FIG. 2, a zirconium source may be provided onto a semiconductor substrate which may be loaded in a chamber (S10). The zirconium source may be adsorbed onto the semiconductor substrate to form an adsorption layer of the zirconium source. The adsorption layer may be one or more atomic or molecular layers of the zirconium source.

The semiconductor substrate may be a bare wafer or a wafer on which other structures, e.g. impurity regions, gate electrodes, insulation layers, conductive layers, contacts, plugs and/or wirings, are formed. For example, the semiconductor substrate, on which a gate electrode, an insulating interlayer covering the gate electrode, a contact plug connecting a capacitor to an impurity region of the semiconductor substrate, and a lower electrode on the contact plug are formed, may be used.

The zirconium source may include, for example, zirconium, carbon and nitrogen. The zirconium source may include, for example, zirconium and alkylamino ligands. For example, the zirconium source may be tetrakis(dialkylamino)zirconium. Non-limiting examples of tetrakis(dialkylamino)zirconium may include tetrakis(ethylmethylamino)zirconium (Zr[N(CH$_3$)(CH$_2$CH$_3$)]$_4$, TEMAZ) represented by Formula 1, tetrakis(diethylamino)zirconium (Zr[N(CH$_2$CH$_3$)2]$_4$), tetrakis(dimethylamino)zirconium (Zr[N(CH$_3$)2]$_4$) and the like.

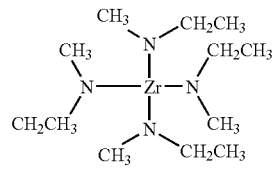

[Formula 1]

A first purging process may be performed on the chamber having the semiconductor substrate (S20). By performing the first purging process, a non-adsorbed portion of the zirconium source may be removed from the semiconductor substrate and the chamber, and the adsorption of the zirconium source may remain on the semiconductor substrate. The first purging process may be performed using, for example, an inactive gas or an inert gas, e.g. argon (Ar), helium (He) or nitrogen (N$_2$).

An oxidizing gas may be provided onto the semiconductor substrate (S30). The oxidizing gas may be a reactive gas to partially or fully oxidize the zirconium source of the adsorption layer. Accordingly, an oxidized adsorption layer of the zirconium source may be formed on the semiconductor substrate. The oxidized adsorption layer of the zirconium source may include, for example, an organic zirconium oxide material. Various oxidizing gas having different oxidizing abilities may be used. Non-limiting examples of the oxidizing gas may include oxygen ($O_2$), ozone ($O_3$), water vapor ($H_2O$) and the like. An oxidizing gas having a relatively low oxidizing ability (e.g. oxygen gas) may partially oxidize the adsorption layer of the zirconium source.

A second purging process may be performed on the chamber having the semiconductor substrate (S40). During the second purging process, a non-reacted portion of the oxidizing gas may be removed from the semiconductor substrate and the chamber. The second purging process may also be performed using an inactive gas or an inert gas.

After performing the second purging process, a nitriding gas may be provided onto the semiconductor substrate (S50). The nitriding gas may be a reactive gas to nitride the zirconium source and/or the oxidized adsorption layer of the zirconium source. Non-limiting examples of the nitriding gas may include ammonia ($NH_3$), nitrous oxide ($N_2O$), nitric oxide (NO) and the like. By nitriding the oxidized adsorption layer of the zirconium source, a zirconium carbo-oxynitride layer having zirconium, carbon, oxygen and nitrogen may be formed on the semiconductor substrate. The zirconium carbo-oxynitride layer may include, for example, carbon which may be mainly originated from organic ligands of the zirconium source.

In some embodiments, the providing of the nitriding gas may be performed using, for example, a nitriding gas activated by plasma. As a result, plasma nitriding may be performed. Plasma may be provided after or while the nitriding gas is provided. Plasma may activate reaction of the nitriding gas and the partially or fully oxidized zirconium source, so the oxidized zirconium source and the nitriding gas may be well combined and a zirconium carbo-oxynitride layer having an improved structural stability may be obtained.

A third purging process may be performed on the chamber having the semiconductor substrate (S60). During the third purging process, a non-reacted portion of the nitriding gas may be removed from the semiconductor substrate and the chamber. The third purging process may also be performed using an inactive gas or an inert gas.

The above steps from S10 to S60 may be repeatedly performed to obtain a predetermined thickness of the zirconium carbo-oxynitride layer. The steps from S10 to S60 may be repeated in a cycle. A layer obtained by performing a single cycle may have a very thin thickness like an atomic layer, so a dielectric layer may be obtained by repeating the cycle, for example, several ten times or several hundred times, based upon the thickness and properties of the dielectric layer or a need of a device. Further, characteristics (e.g. a dielectric constant, a temperature of crystallization or a leakage current) of the dielectric layer may be changed in accordance with, for example, contents of carbon, oxygen and/or nitrogen, and thus types, amounts or feeding time of an oxidizing gas and/or a nitriding gas, a pressure level and the like may be properly adjusted.

In some example embodiments, all cycles may be performed using the same conditions of process, e.g. a type or a feed amount of the oxidizing gas, a type or a feed amount of the nitriding gas, pressure levels, temperature, etc. In other embodiments, the conditions of process may be changed as the cycles are repeated. By changing the conditions of process of the cycles, the zirconium carbo-oxynitride layer including a plurality of sub-layers of different components may be obtained. Such zirconium carbo-oxynitride layer having different sub-layers may have a higher temperature of crystallization as compared with that of a zirconium carbo-oxynitride layer having uniform sub-layers. Therefore, the zirconium carbo-oxynitride layer having different sub-layers may reduce the generation of leakage current.

For example, a first layer of zirconium carbo-oxynitride may be formed on the semiconductor substrate by performing a first cycle, and then a second layer of zirconium carbo-oxynitride may be formed on the first layer by performing a second cycle. In some embodiments, the second layer may be formed by using, for example, types or amounts of an oxidizing gas and/or a nitriding gas, and/or a pressure level the same as or different from those used in the first cycle. The second layer may have contents of oxygen, carbon and/or nitrogen the same as or different from those of the first layer. Further, a third layer of zirconium carbo-oxynitride may be formed on the second layer by performing a third cycle. The third layer may be formed by using, for example, types or amounts of reactive gases, and/or a pressure level the same as or different from those used in the first cycle or the second cycle. The third layer may have, for example, contents of oxygen, carbon and/or nitrogen the same as or different from those of the first layer or the second layer. The first cycle, the second cycle and the third cycle may be a single cycle of steps from S10 to S60, or at least two or more cycles of steps from S10 to S60.

Figure 3A:
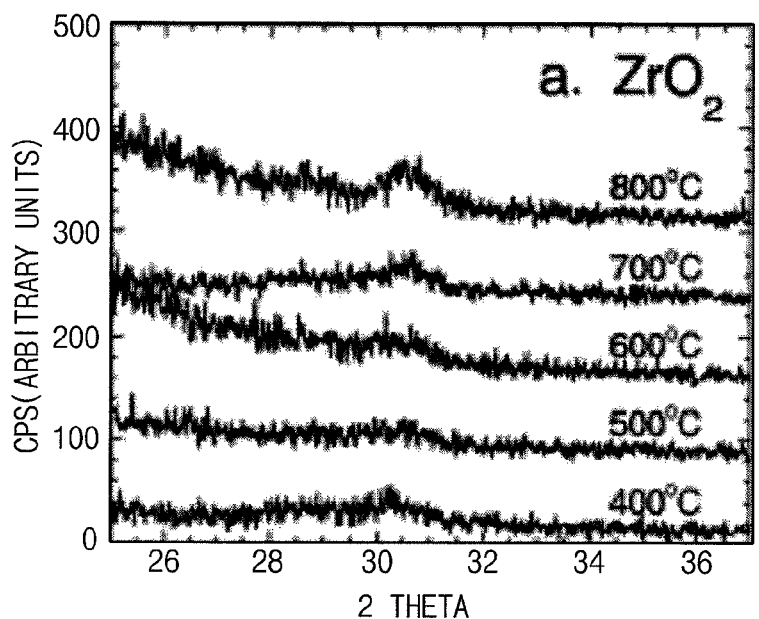
FIGS. 3A and 3B are graphs illustrating variations of crystalline structures in zirconium oxide and zirconium oxynitride, each being annealed at several different temperatures for about one minute.
Figure 3B:
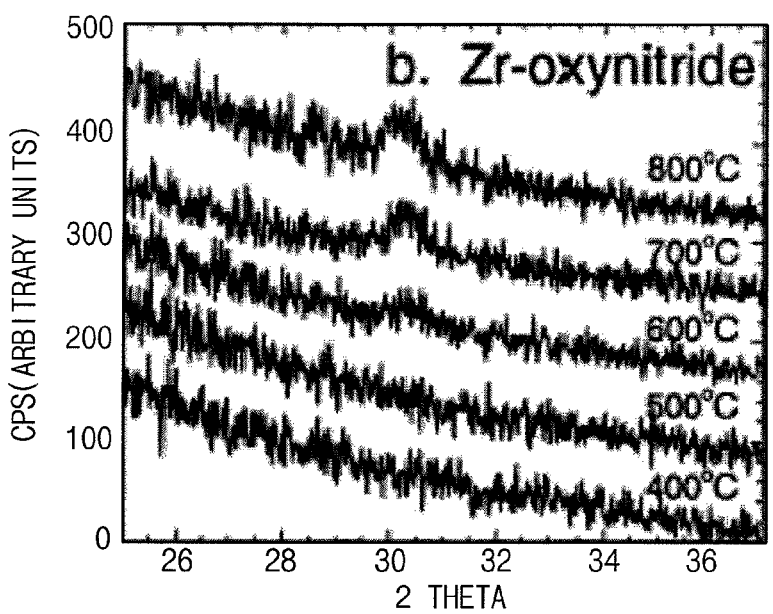

The zirconium carbo-oxynitride layer may have a high temperature of crystallization relative to a zirconium oxide layer. FIGS. 3A and 3B are graphs illustrating variations of crystalline structures in zirconium oxide and zirconium oxynitride, each being annealed at several different temperatures for about one minute, which are disclosed in the related art "IEEE Transactions on electron devices, Vol. 50, No. 2, p. 333, 2003, the disclosure of which is hereby incorporated by reference herein in it's entirety." Referring to FIGS. 3A and 3B, zirconium oxide is crystallized as being annealed at about 400° C., whereas zirconium oxynitride is not crystallized at about 600° C. When the content of nitrogen in zirconium oxynitride is about 5%, zirconium oxynitride may not be crystallized up to about 700° C. Like zirconium oxynitride, zirconium carbo-oxynitride may also have a temperature of crystallization higher than that of zirconium oxide. Thus, a dielectric layer having zirconium carbo-oxynitride may not be readily crystallized through a subsequent thermal process or an annealing process to reduce or suppress generation of leakage current through a crystallized portion.

Figure 4:
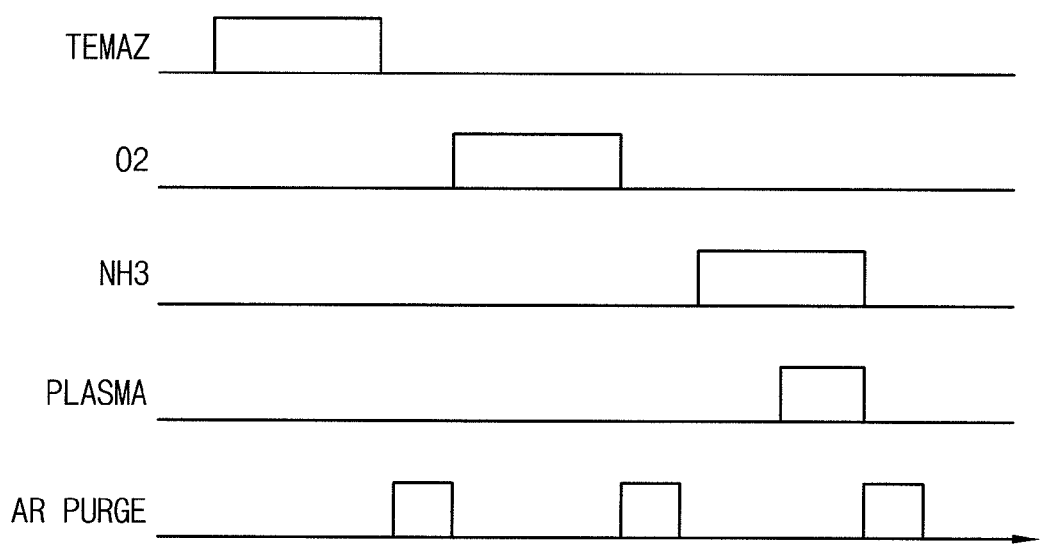
Figure 5:
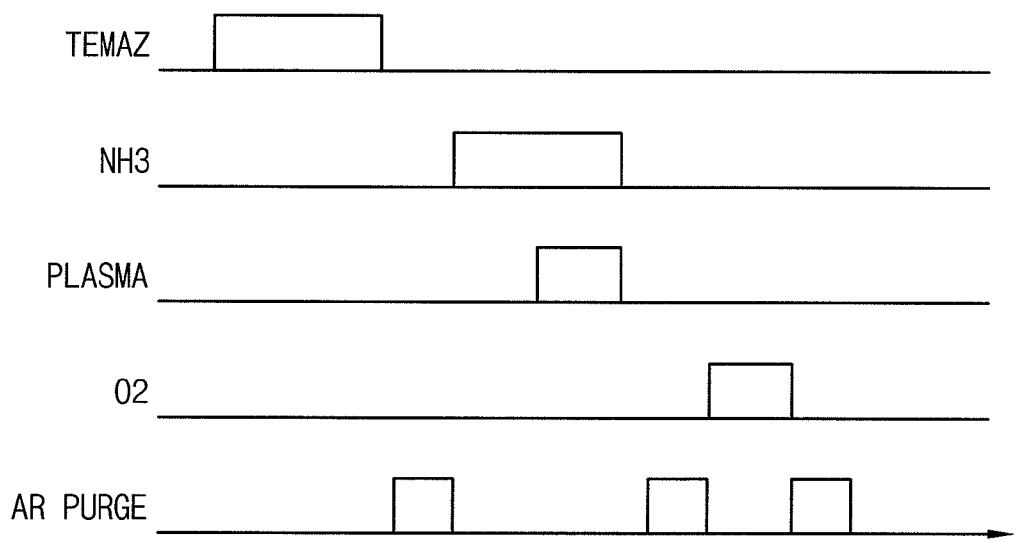
Figure 6:
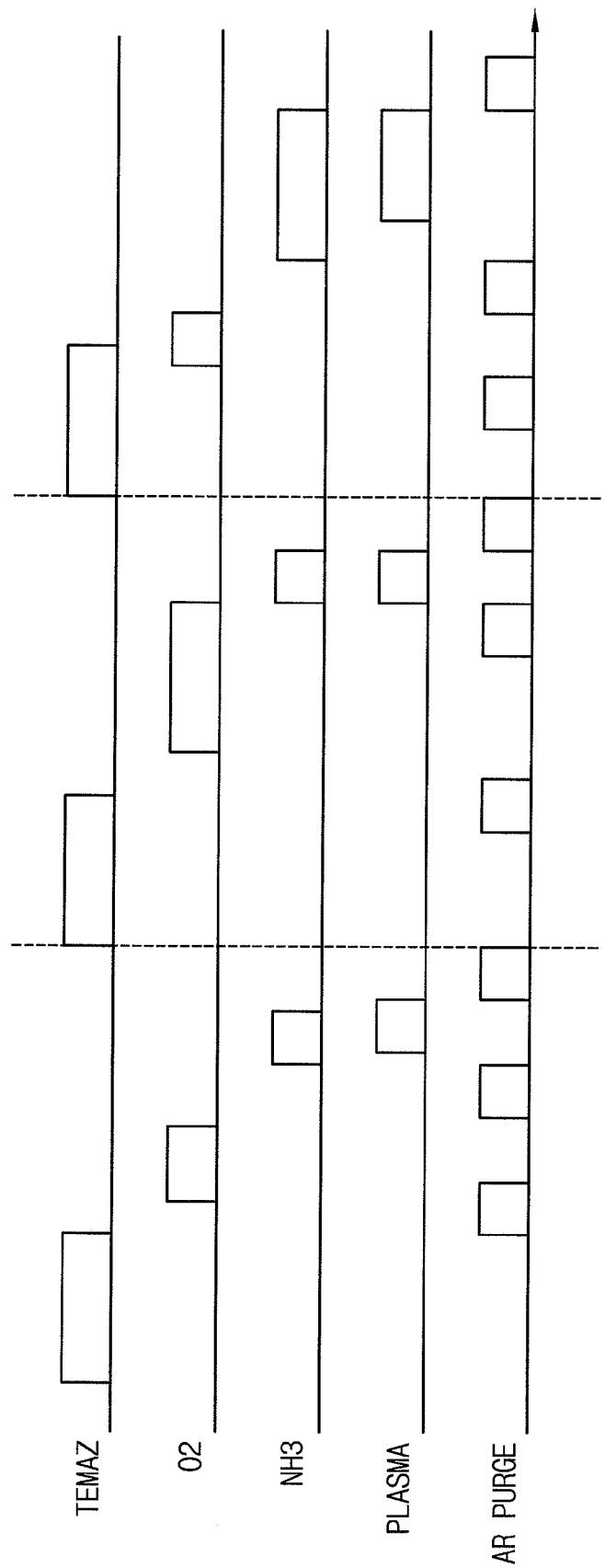

FIGS. 4 through 6 are diagrams illustrating exemplary sequences of providing reactive gases in a method of forming a zirconium carbo-oxynitride layer through an ALD process.

FIGS. 4 and 5 illustrate different sequences of providing the oxidizing gas and the nitriding gas. Referring to FIG. 4, a first zirconium carbo-oxynitride layer may be formed by, for example, sequentially and repeatedly providing a zirconium source (e.g. TEMAZ), a first purging gas (e.g. Ar), an oxidizing gas (e.g. $O_2$), a second purging gas (e.g. Ar), a nitriding gas (e.g. $NH_3$) and a third purging gas (e.g. Ar). After or while the nitriding gas is provided, plasma may also be provided. Referring to FIG. 5, a second zirconium carbo-oxynitride layer may be formed by, for example, sequentially and repeatedly providing a zirconium source (e.g. TEMAZ), a first purging gas (e.g. Ar), a nitriding gas (e.g. $NH_3$), a second purging gas (e.g. Ar), an oxidizing gas (e.g. $O_2$), a third purging gas (e.g. Ar). After or while the nitriding gas is provided, plasma may also be provided.

Referring to FIGS. 4 and 5, process conditions are the same as each other except for a sequence providing the oxidizing gas and the nitriding gas. When the providing of the nitriding gas is done prior to providing an oxidizing gas as illustrated in FIG. 5, the zirconium source may be primarily reacted with the nitriding gas before being oxidized. When a nitride layer of the zirconium source is firstly formed, the nitride layer may not be readily oxidized by the oxidizing agent. Thus, the second zirconium carbo-oxynitride layer may have a content of nitrogen greater than that of the first zirconium carbo-oxynitride layer. Additionally, the first zirconium carbo-oxynitride layer may have a content of carbon smaller than that of the second zirconium carbo-oxynitride layer, because a carbon component or an organic ligand may be more readily exhausted or removed by the oxidizing agent.

Figure 7:
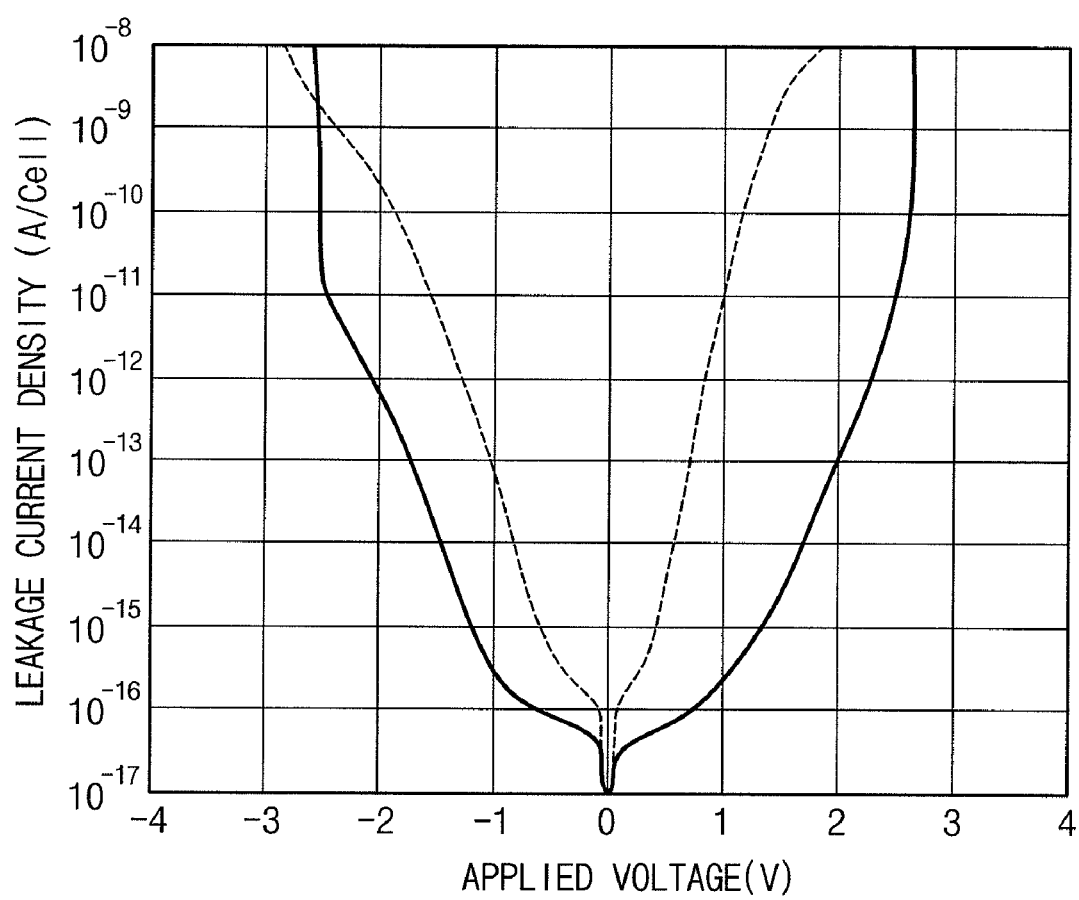

FIG. 7 is a graph illustrating a leakage current density (A/cell) vs. applied voltage (V) measured from capacitors having zirconium carbo-oxynitride layers formed by the methods of FIGS. 4 and 5. In FIG. 7, the solid line is a result measured from the first zirconium carbo-oxynitride layer formed using the sequence illustrated in FIG. 4, and the dotted line is a result measured from the second zirconium carbo-oxynitride layer formed using the sequence illustrated in FIG. 5. Further, the first zirconium carbo-oxynitride layer was measured to have an equivalent oxide thickness (EOT) of about 7.1 Å and a dielectric constant of about 30.76, and the second zirconium carbo-oxynitride layer was measured to have an EOT of about 9.3 Å a dielectric constant of about 21.56.

Referring to FIG. 7, it may be noted that the first zirconium carbo-oxynitride layer having a smaller EOT shows better leakage current characteristics than those of the second zirconium carbo-oxynitride layer having a larger EOT. For the first zirconium carbo-oxynitride layer, a leakage current density of about 1 fA/cell (femto ampere/cell) was measured when a voltage of about −1.2V/1.3V was applied. For the second zirconium carbo-oxynitride layer, a leakage current density of about 1 fA/cell (femto ampere/cell) was measured when a voltage of about −0.6V/0.4V was applied. Therefore, it may be noted that providing the oxidizing gas prior to the nitriding gas may significantly improve the electrical characteristics of the zirconium carbo-oxynitride layer, e.g. a small leakage current and a high dielectric constant per thickness, as compared with those of providing the nitriding gas prior to the oxidizing gas.

A difference between the process of FIG. 4 and the process of FIG. 5 is an order of providing the oxidizing gas and the nitriding gas. Due to such difference, the contents of nitrogen, carbon and oxygen contained in the first and the second zirconium carbo-oxynitride layers may be different from each other. The first zirconium carbo-oxynitride layer formed by the process of FIG. 4 may have relatively a larger content of zirconium oxide and smaller contents of carbon and nitrogen than those of the second zirconium carbo-oxynitride layer. Thus, it may be noted that a zirconium carbo-oxynitride layer having smaller contents of carbon and nitrogen may exhibit improved electrical characteristics.

Owing to addition of carbon and nitrogen, the zirconium carbo-oxynitride layer as a dielectric layer may have a high temperature of crystallization. However, the amounts of carbon and nitrogen contained in the zirconium carbo-oxynitride layer may be limited to improve a dielectric constant, an EOT, and/or a leakage current characteristic. By following the sequence illustrated in FIG. 4, a zirconium carbo-oxynitride layer having proper amounts of carbon and nitrogen may be obtained. Providing the oxidizing gas prior to providing the nitriding gas may reduce amounts of carbon and nitrogen included in the zirconium carbo-oxynitride layer ($ZrO_{2-x-y}C_xN_y$). Further, using plasma after providing the nitriding gas may stably combine zirconium, carbon, oxygen and nitrogen to enhance the stability of the zirconium carbo-oxynitride layer.

FIG. 6 is a diagram illustrating an exemplary sequence of providing reactive gases in a method of forming a zirconium carbo-oxynitride layer through an ALD process. Referring to FIG. 6, feed times (or feed amounts) of the oxidizing gas and/or the nitriding gas may be changed while a plurality of cycles are performed. A zirconium carbo-oxynitride layer obtained after performing such a plurality of cycles may have different compositions and crystalline properties of a plurality of atomic layers. Each atomic layer of the zirconium carbo-oxynitride layer ($ZrO_{2-x-y}C_xN_y$) may have a different ratio of oxygen (2-x-y), carbon (x) and nitrogen (y). Thus, the zirconium carbo-oxynitride layer having such a plurality of the atomic layers may not be readily crystallized through an entire layer, so a zirconium carbo-oxynitride layer having very few or no paths of leakage current may be obtained.

The zirconium carbo-oxynitride layer may have a chemical formula of, for example, $ZrO_{2-x-y}C_xN_y$, in which x and y satisfy $0<x<2$, $0<y<2$ and $0<x+y<2$. In example embodiments, the zirconium carbo-oxynitride layer may include a plurality of atomic layers or sub-layers of zirconium carbo-oxynitride having a chemical formula of $ZrO_{2-x-y}C_xN_y$, in which x and y satisfy $0<x<2$, $0<y<2$ and $0<x+y<2$. At least two of the atomic layers may have different values of x and/or y from each other. In other example embodiments, the plurality of atomic layers may have a repeating unit of at least two atomic layers which have different values of x and/or y.

For example, as illustrated in FIG. 6, a plurality of cycles may be basically performed by providing a zirconium source (e.g. TEMAZ) into a chamber, purging the chamber (e.g. using Ar), providing an oxidizing gas (e.g. $O_2$) into the chamber, purging the chamber (e.g. using Ar), providing a nitriding gas (e.g. $NH_3$) and purging the chamber (e.g. using Ar). A second cycle may be carried out using, for example, different types, amounts or feed times of an oxidizing gas and/or a nitriding gas, and/or a different pressure level from those of a first cycle. A third cycle may also be performed using, for example, types, amounts or feed times of an oxidizing gas and/or a nitriding gas, and/or a pressure level different from those of the first cycle and/or the second cycle. Each atomic layer of the zirconium carbo-oxynitride layer ($ZrO_{2-x-y}C_xN_y$) thus obtained may have a different ratio of oxygen (2-x-y), carbon (x) and nitrogen (y). The ratio of oxygen, carbon and nitrogen may vary with respect to all atomic layers, or may vary in groups of cycles.

In some example embodiments, at least two or more cycles may use, for example, different types, feed amounts and/or pressure levels of the oxidizing gas and/or the nitriding gas. In other example embodiments, the cycles are divided into at least two groups, and the at least two groups of cycles may use, for example, different types, feed amounts and/or pressure levels of the oxidizing gas and/or the nitriding gas.

The zirconium carbo-oxynitride layer having different amounts of oxygen, carbon and/or nitrogen in a plurality of atomic layers may not be readily crystallized in all atomic layers, although crystallization may occur in a single atomic layer of the zirconium carbo-oxynitride layer. Thus, growth of crystal with a large size may be suppressed, and generation of a leakage current through a crystallized portion may be reduced.

In example embodiments, the sequence of FIG. 4 and the sequence of FIG. 5 may be employed together in forming a zirconium carbo-oxynitride layer having a plurality of atomic layers. According to the type of a device, various dielectric layers having a higher dielectric constant or a lower dielectric constant may be provided. For example, a dielectric layer of a capacitor may have a dielectric constant different from that of a transistor in a circuit of a device. At least one or any combinations of the sequences of FIGS. 4 through 6 may be properly adapted, or other metals (e.g. hafnium, titanium, tantalum, etc.) instead of zirconium may be employed to form various dielectric layers.

Methods of Manufacturing a Semiconductor Device

FIGS. 8 through 15 are cross-sectional views illustrating a method of manufacturing a DRAM device according to example embodiments.

Figure 8:
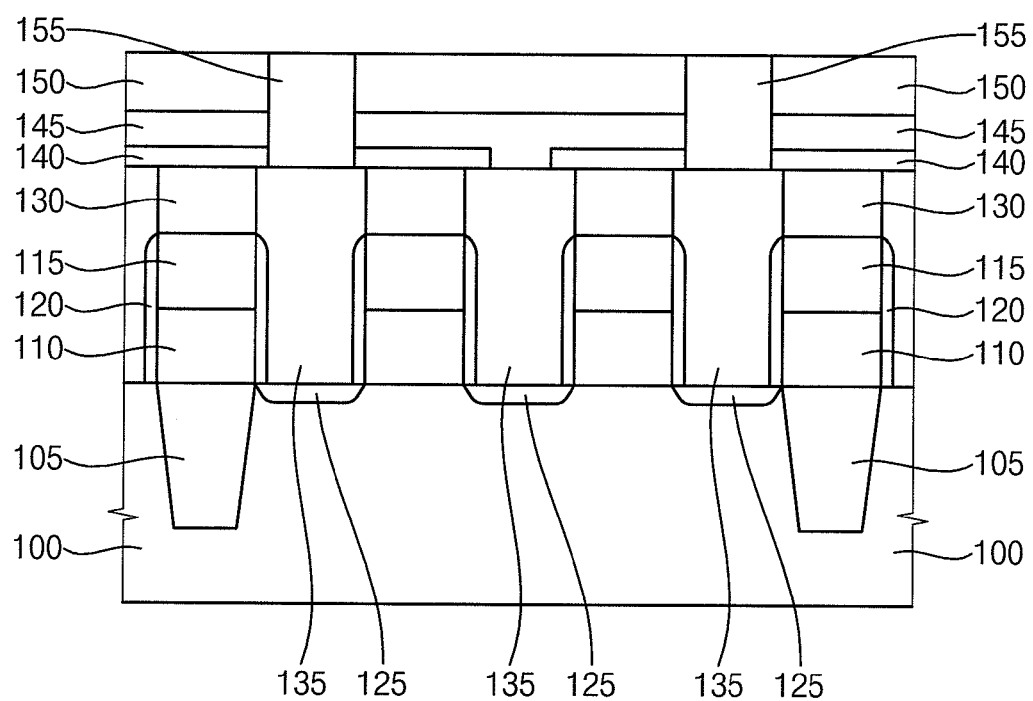

Referring to FIG. 8, an isolation layer 105 may be formed on a semiconductor substrate 100. A gate electrode structure including a gate dielectric layer, a gate conductive layer 110, a gate mask 115 and a gate spacer 120 may formed on the semiconductor substrate 100. The gate dielectric layer may be formed by using the methods of forming a zirconium carbo-oxynitride layer according to example embodiments. Impurity regions 125 may be formed at the semiconductor substrate 100 adjacent to the gate electrode structure. A first insulating interlayer 130 may be formed on the semiconductor substrate to cover the gate electrode structure. After forming a first contact hole through the first insulating interlayer 130 to expose the impurity regions 125, a first contact plug 135 may be formed in the first contact hole.

A second insulating interlayer 140 may be formed on the first contact plug 135 and the first insulating interlayer 130, and then a bit line 145 may be formed on the second insulating interlayer 140. A bit line contact may be formed through the second insulating interlayer 140 to connect the bit line 145 to the first contact plug 135. A third insulating interlayer 150 may be formed on the second insulating interlayer 140 to cover the bit line 145. After forming a second contact hole through the second and the third insulating interlayers 140 and 150 to expose the first contact plug 135, a second contact plug 155 may be formed in the second contact hole.

Figure 9:
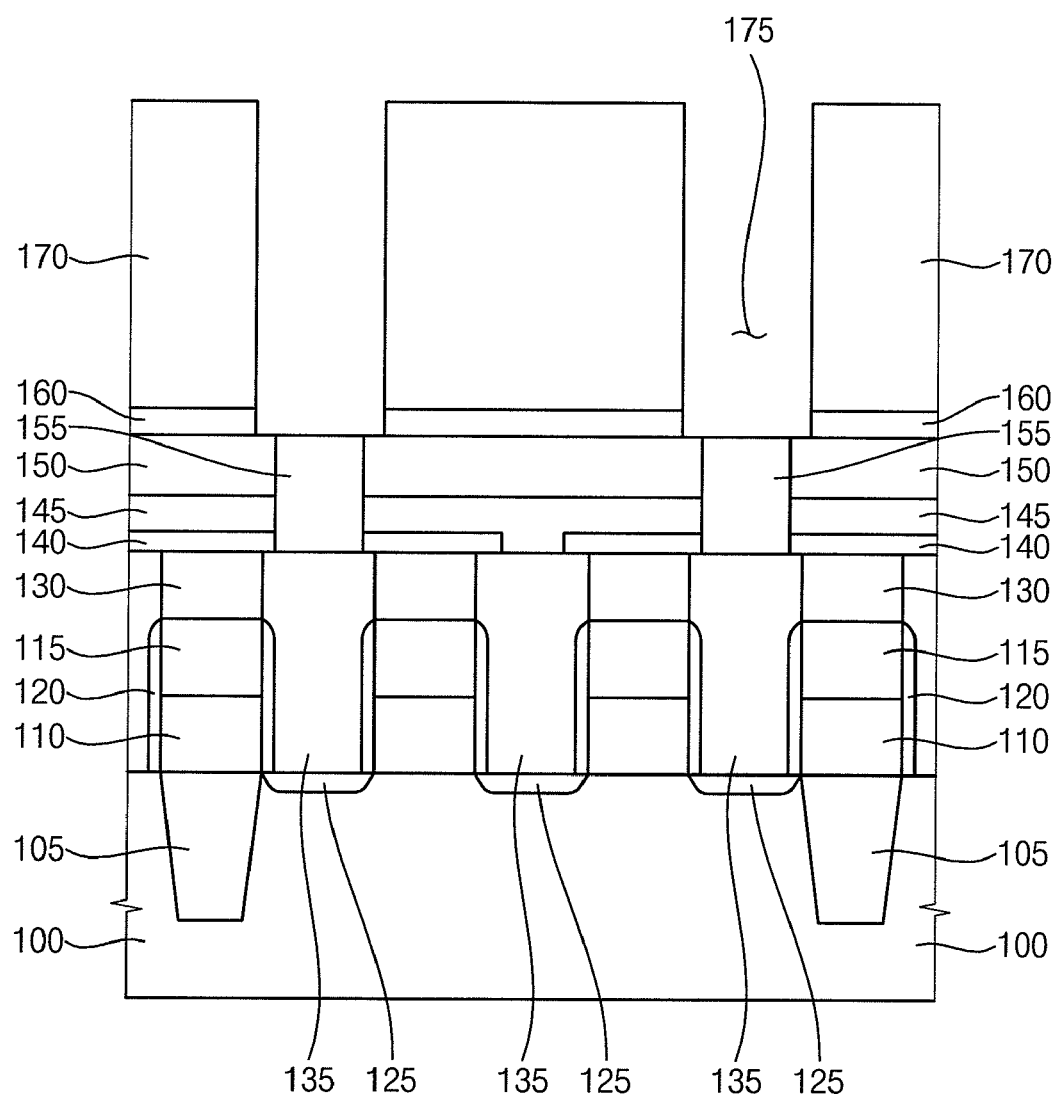

Referring to FIG. 9, an etch stop layer 160 may be formed on the third insulating interlayer 150 and the second contact plug 155. The etch stop layer 160 may be formed by, for example, performing a CVD process using silicon nitride. A mold layer 170 may be formed on the etch stop layer 160. The mold layer 170 may be formed to have a predetermined thickness based upon, for example, the surface area of a capacitor. The mold layer 170 may be formed to have a thickness of, for example, about 10,000 Å to about 20,000 Å. The mold layer 170 may be formed to have a single layer or a plurality of sub-layers which may have different etch rates. A plurality of holes 175 for a capacitor electrode may be formed in the mold layer 170 by performing, for example, a photolithography process. The plurality of holes 175 for the capacitor electrode may be formed to expose the second contact plug 155 by removing a portion of the etch stop layer 160.

Figure 10:
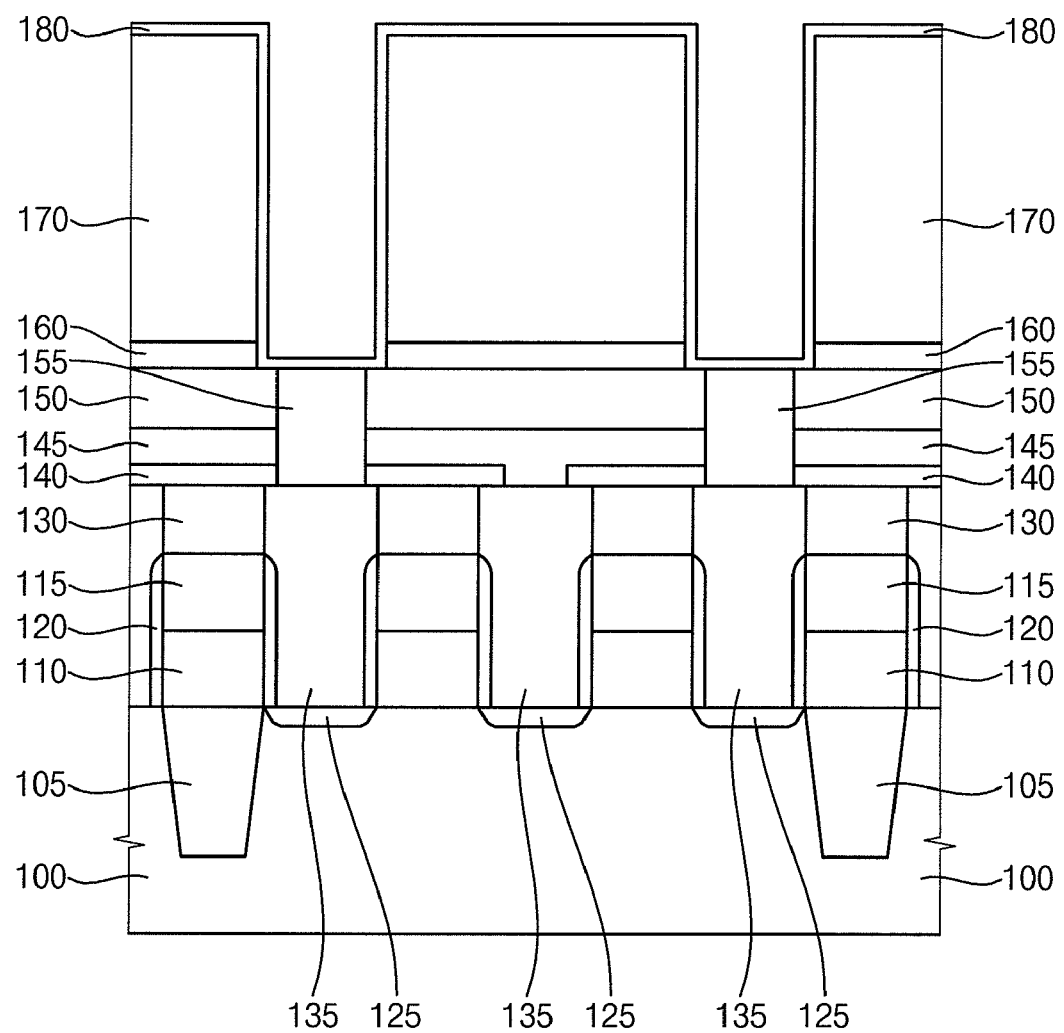

Referring to FIG. 10, a lower electrode layer 180 may be formed on the mold layer 170 having the plurality of holes 175. The lower electrode layer 180 may be formed using a conductive material, e.g. titanium nitride (TiN), titanium (Ti), tantalum nitride (TaN), platinum (Pt), etc. The lower electrode layer 180 may be contacted with the second contact plug 155. The lower electrode layer 180 may be supported by the etch stop layer 160 having a sufficient thickness after the mold layer 170 is removed in a subsequent process.

Figure 11:
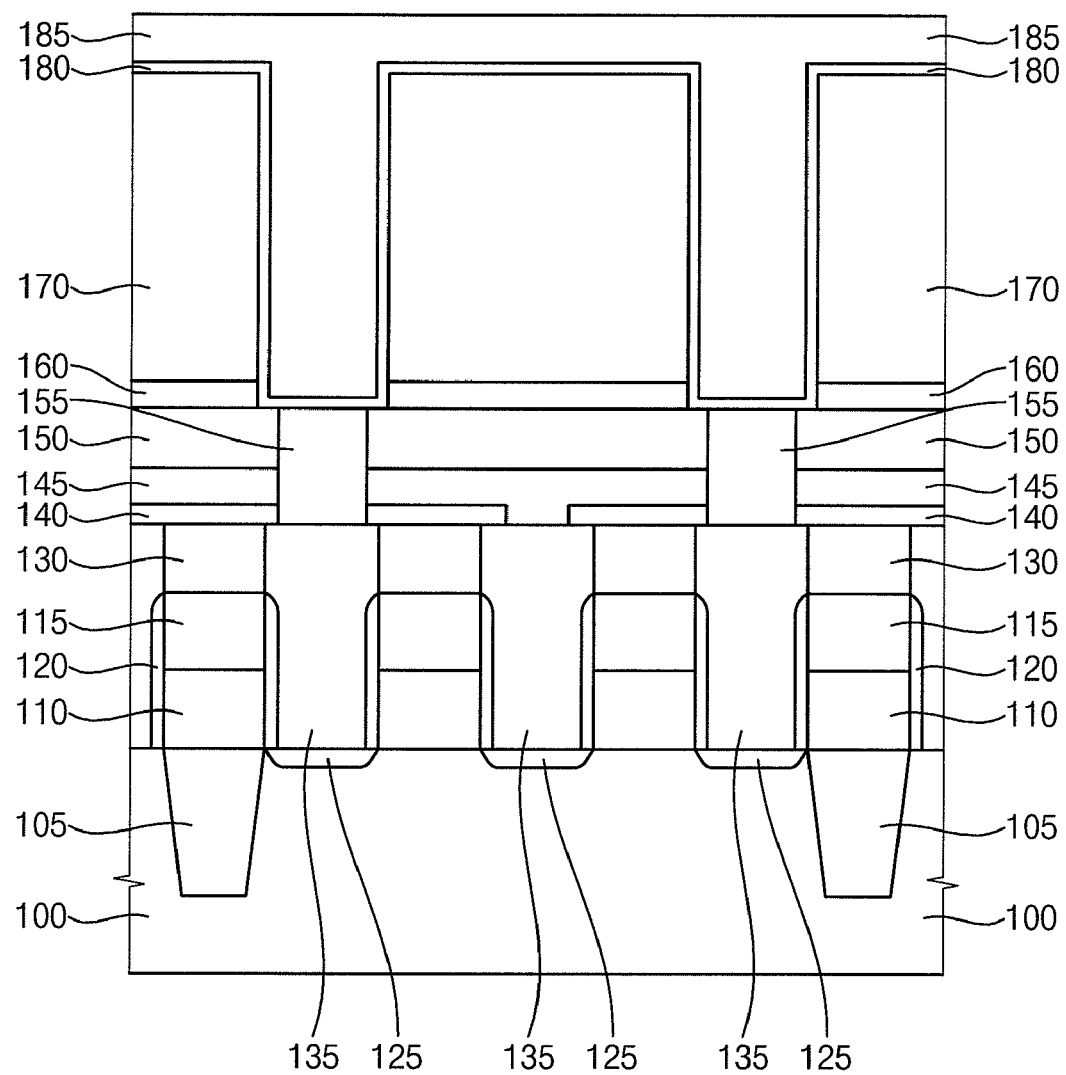

Referring to FIG. 11, a buffer layer 185 may be formed on the lower electrode 170 to fill the holes 175. The buffer layer 185 may be formed using an insulation material substantially the same as or different from that of the mold layer 170. When the buffer layer 185 and the mold layer 170 are formed using the same material, the buffer layer 185 and the mold layer 170 may be simply removed by the same removal process after forming a lower electrode, but in such a case the lower electrode may be readily fallen down. Forming the buffer layer 185 and the mold layer 170 using different materials may reduce generation of a defect. For example, the buffer layer 185 may be formed using a photosensitive material which may be different from an insulation material of the mold layer 170.

Figure 12:
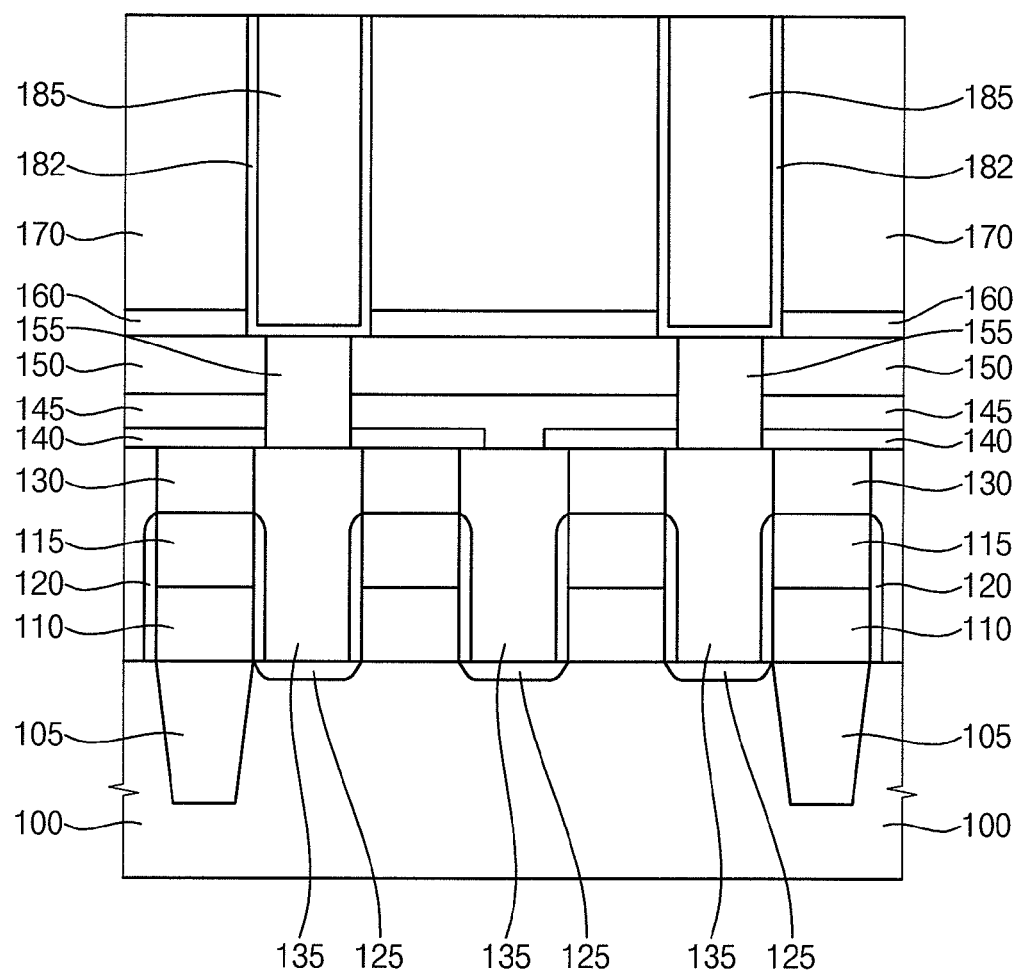

Referring to FIG. 12, upper portions of the buffer layer 185, the mold layer 170 and the lower electrode layer 180 may be removed by, for example, an etch back process to form a lower electrode 182 which is isolated by the mold layer 170. A top portion of the lower electrode 182 may be formed to have a round shape by performing, for example, a wet etching process on the mold layer 170 and the top portion of the lower electrode 180. When the top portion of the lower electrode 182 is sharp, a dielectric layer of a capacitor may be broken or a leakage current from the top portion of the lower electrode 182 may be generated.

Figure 13:
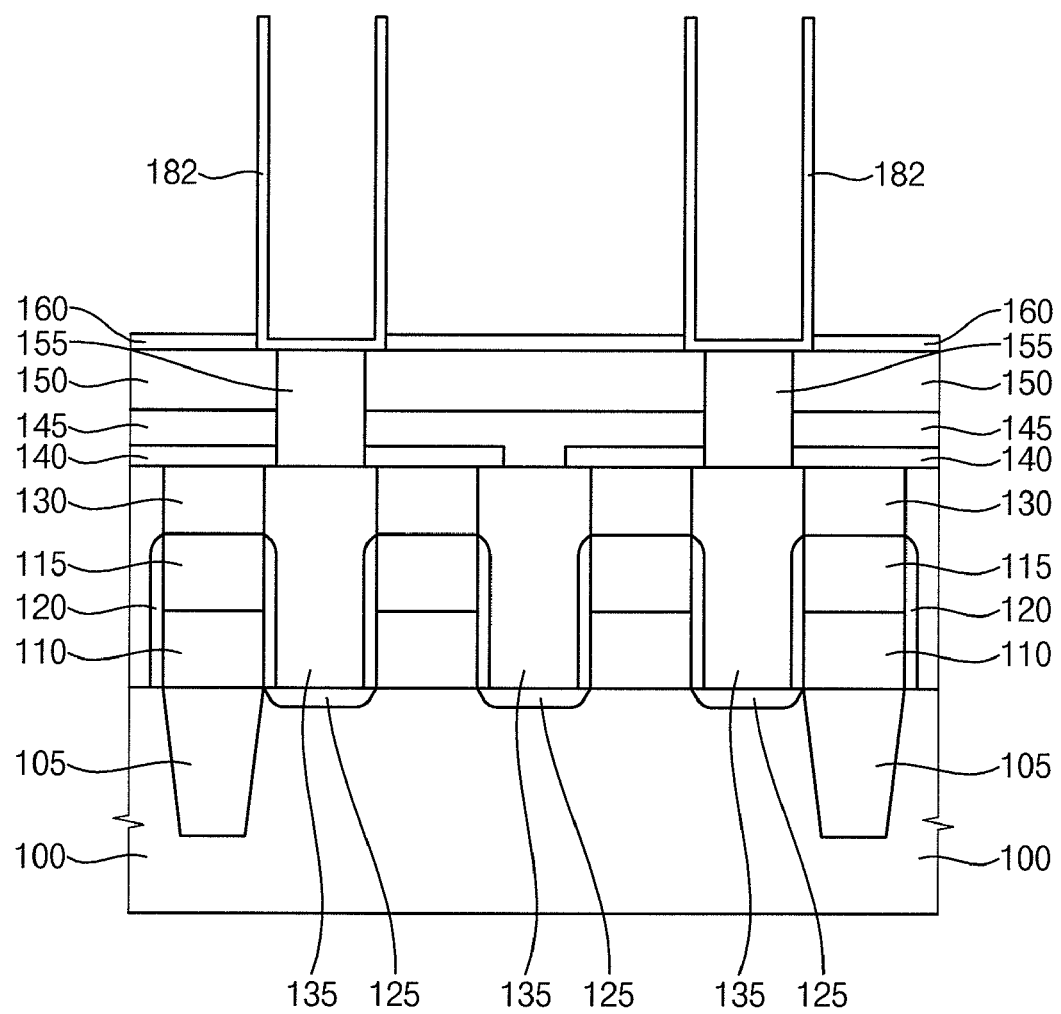

Referring to FIG. 13, the buffer layer 185 and the mold layer 170 may be removed from the semiconductor substrate 100. For example, the buffer layer 185 and the mold layer 170 may be removed by a lift-off process using a limulus amebocyte lysate (LAL) solution which may include deionized water, ammonium hydrofluoride and hydrofluoric acid. Removing the buffer layer 185 and the mold layer 170 may be carefully performed such that adjacent lower electrodes 182 may not be contacted with each other or fallen down. Moreover, an additional structure for supporting the lower electrode 182 may be formed such that adjacent lower electrodes 182 may not be contacted with each other or fallen down. A supporting structure, e.g. having a ladder shape or a ring shape, may be formed around the lower electrode 182.

Figure 14:
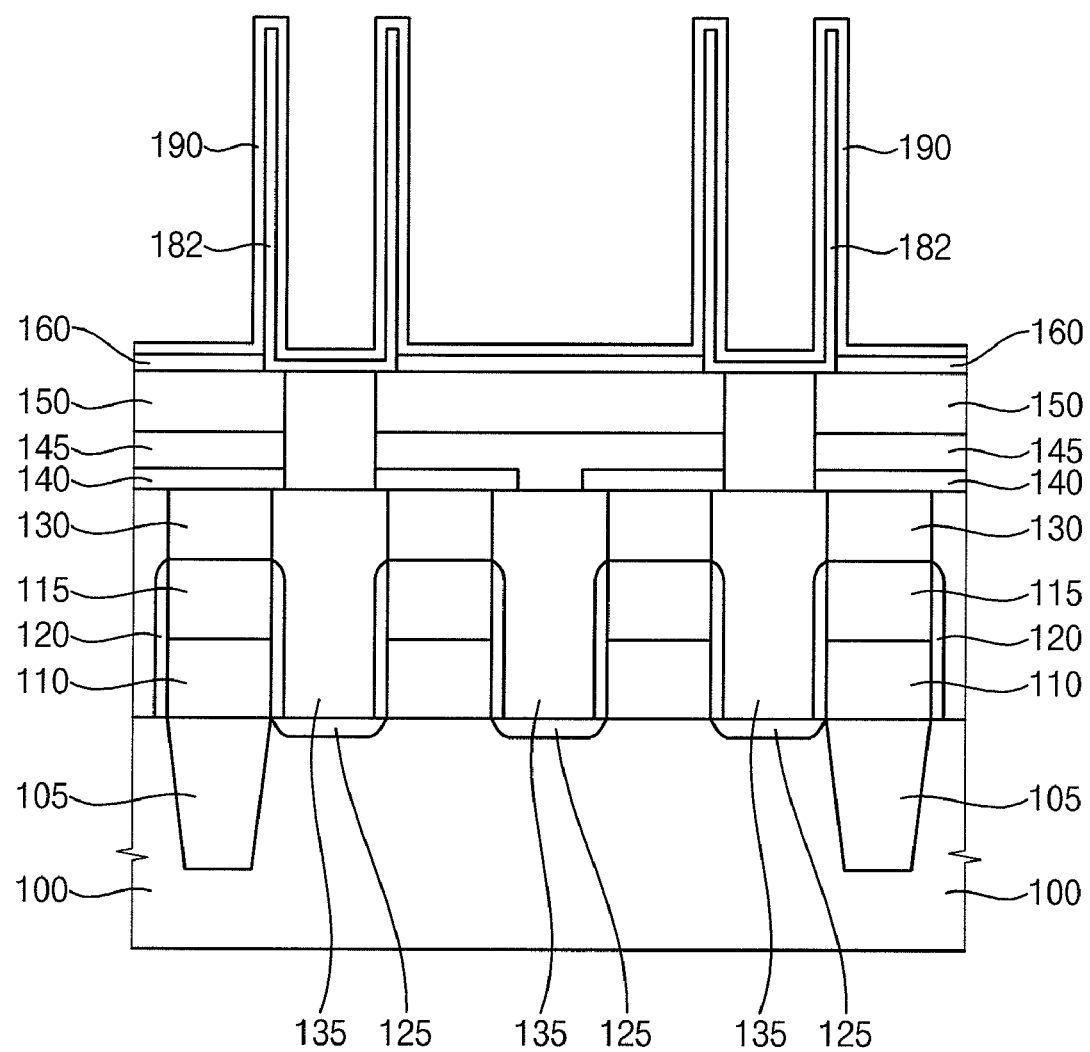

Referring to FIG. 14, a dielectric layer 190 may be formed on the lower electrode 180. The dielectric layer 190 may be formed by the above-mentioned methods of forming a zirconium carbo-oxynitride layer according to example embodiments. For example, the semiconductor substrate on which the lower electrode 182 and other structure are formed, are loaded in a reaction chamber for an ALD process. A zirconium source (e.g. TEMAZ) may be provided into the chamber to form a chemical adsorption layer of the zirconium source on the lower electrode 182.

After purging the chamber using an inactive gas (e.g. Ar, He or $N_2$) to remove a non-adsorbed portion of the zirconium source, an oxidizing gas (e.g. $O_2$, $O_3$ or $H_2O$) may be provided into the chamber to oxidize the chemical adsorption layer of the zirconium source. As a result, an oxidized organic zirconium layer may be formed on the lower electrode 182. While the zirconium source is reacted with the oxidizing gas, an organic component (e.g. an alkylamino ligand) may be partially removed from the zirconium source. Thus, the oxidized adsorption layer of the zirconium source may have a reduced amount of carbon and nitrogen relative to the zirconium source. The oxidizing gas may partially take part in the reaction with the zirconium source adsorbed onto the lower electrode 182, and a portion of the oxidizing gas may remain with a non-reacted state. The rate of a chemical reaction between the zirconium source and the oxidizing gas may depend on, for example, the pressure and/or the temperature, and the reaction degree may also vary depending on an oxidizing ability of the oxidizing gas. Thus, for example, the pressure, the temperature and/or a type of the oxidizing gas may be properly adjusted such that the dielectric layer 190 may be formed to have predetermined amounts of carbon and nitrogen.

A purging gas (e.g. Ar, He or $N_2$) may be provided into the chamber to remove any remaining oxidizing gas from the chamber. After purging the chamber, a nitriding gas may be provided into the chamber. Examples of the nitriding gas may include but are not limited to NO, $NO_2$, $NH_3$, etc. While the nitriding gas is provided, plasma may also be provided into the chamber. The oxidized adsorption layer of the zirconium source may be nitrided by, for example, the nitriding gas and plasma, and binding forces between zirconium, oxygen, carbon and nitrogen may increase to form a zirconium carbo-oxynitride layer having an improved stability. When the amount of nitrogen included in the zirconium carbo-oxynitride layer is excessive, electrical characteristics, e.g. a dielectric constant, an EOT or a leakage current, may be deteriorated. Thus, the providing amount of the nitriding gas may be limited. After providing the nitriding gas, a purging gas may be provided into the chamber to remove a non-reacted portion of the nitriding gas. The zirconium carbo-oxynitride layer thus formed may have a formula of, for example, $ZrO_{2-x-y}C_xN_y$. A basic atomic layer may be formed on the lower electrode layer 182 by performing one cycle of ALD. The dielectric layer 190 may be formed to have a predetermined thickness by repeating a plurality of the cycles.

In some example embodiments, all cycles may be performed using the same conditions of process. In other example embodiments, the conditions of process may be changed as the cycles are repeated. By changing the conditions of process, e.g. a type or a feed amount of the oxidizing gas, a type or a feed amount of the nitriding gas, pressure levels, temperature, etc, the zirconium carbo-oxynitride layer which includes a plurality of sub-layers of different amounts of carbon, oxygen and nitrogen may be obtained. In still other example embodiments, the zirconium carbo-oxynitride layer may be prepared by repeatedly forming the plurality of sub-layers of different components.

For example, a first layer may be formed in a first cycle to include a relatively large amount of carbon by reducing a feed amount of the oxidizing gas and/or a pressure level, and then a second layer may be formed in a second cycle to include a relatively small amount of carbon and a relatively large amount of oxygen by raising a feed amount of the oxidizing gas and/or a pressure level or using a relatively strong oxidizing gas. By repeatedly performing a cycle group including the first cycle and the second cycle, a zirconium carbo-oxynitride layer, in which the first layer and the second layer are alternately repeated, may be obtained. In this manner, a zirconium carbo-oxynitride layer having different compositions and crystalline structures in a plurality of sub-layers may be obtained.

When a zirconium carbo-oxynitride layer has a homogenous composition and uniform crystalline properties in all sub-layers, all the sub-layers of the zirconium carbo-oxynitride layer may be crystallized at almost 100% under a specific condition. When a zirconium carbo-oxynitride layer includes sub-layers having different compositions and crystalline properties, all the sub-layers of the zirconium carbo-oxynitride layer may not be uniformly crystallized up to about 100%, and some of the sub-layers may act as an inhibition layer of crystallization to suppress generation of a leakage current through a crystallized portion.

The dielectric layer 190 may include a plurality of atomic layers of zirconium carbo-oxynitride having a chemical formula of, for example, $ZrO_{2-x-y}C_xN_y$. In some embodiments, at least two of the atomic layers may have different values of x and/or y from each other. In other embodiments, the plurality of atomic layers may have a repeating unit of at least two atomic layers which have different values of x and/or y.

Figure 15:
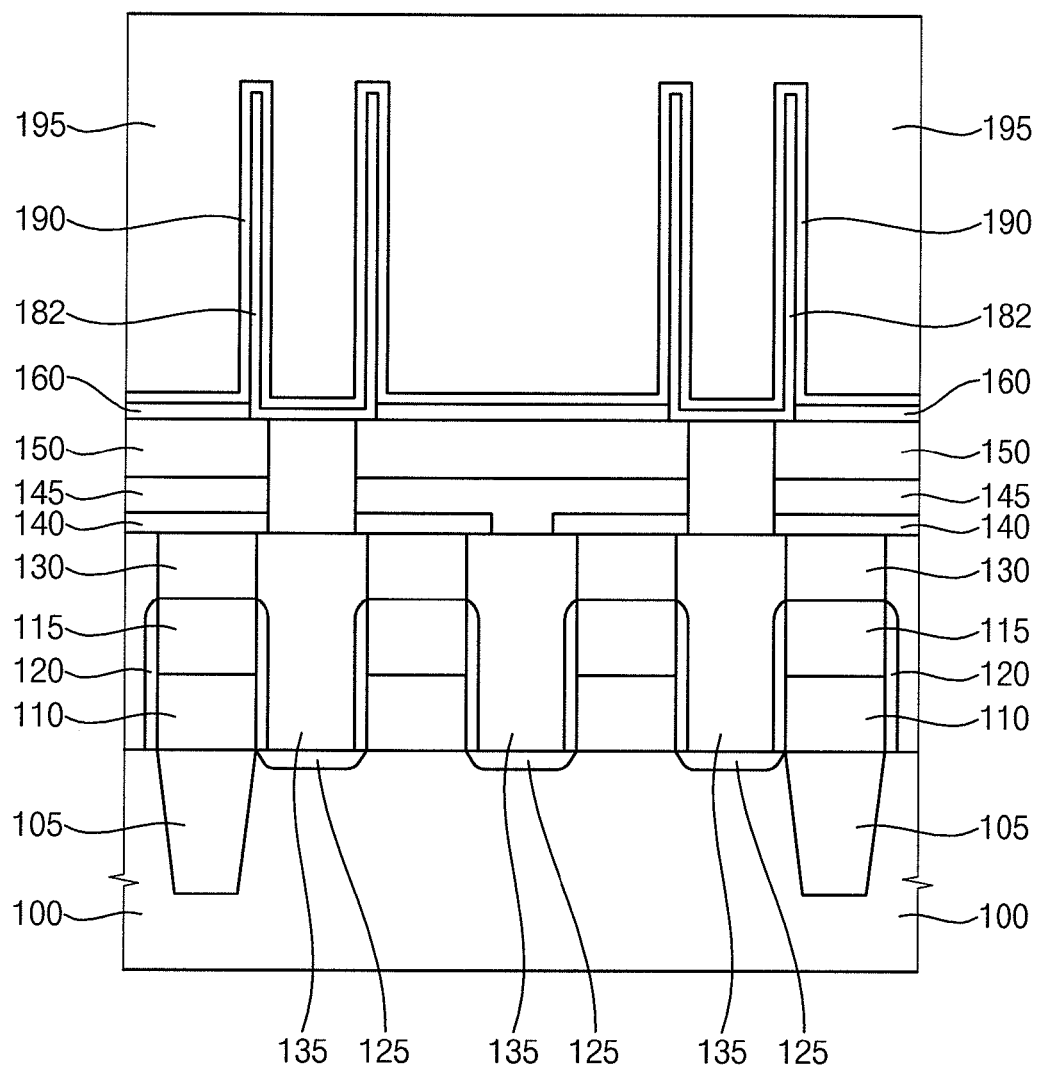

Referring to FIG. 15, an upper electrode 195 may be formed on the dielectric layer 190. The upper electrode 195 may be formed using a conductive material, e.g. TiN, Ti, TaN, Pt, etc. In addition, an insulating interlayer and a metal wiring may be formed on or over the upper electrode. As a result, a high performance dynamic random access memory (DRAM) device having reduced defect or leakage current may be obtained.

FIGS. 16 through 19 are cross-sectional views illustrating a method of manufacturing a capacitor of a logic device according to example embodiments.

Figure 16:
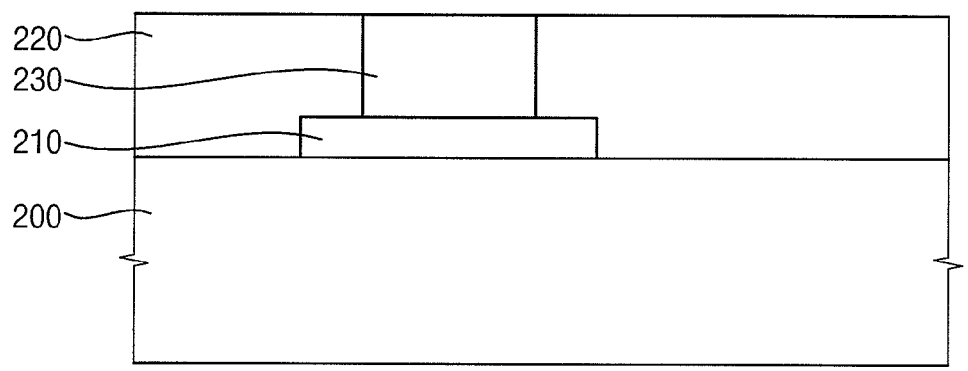

Referring to FIG. 16, a lower wiring 210 may be formed on a semiconductor substrate 200. The lower wiring 210 may be adapted to apply power to a device. The lower wiring 210 may be formed using a conductive material, e.g. a metal or polysilicon doped with impurities. A first insulating interlayer 220 may be formed on the semiconductor substrate 200 to cover the wiring 210. A lower contact hole may be formed in the first insulating interlayer 220 to expose the wiring 210, and then a lower contact plug 230 may be formed in the lower contact hole. The lower contact plug 230 may be formed, for example, using copper or tungsten.

Figure 17:
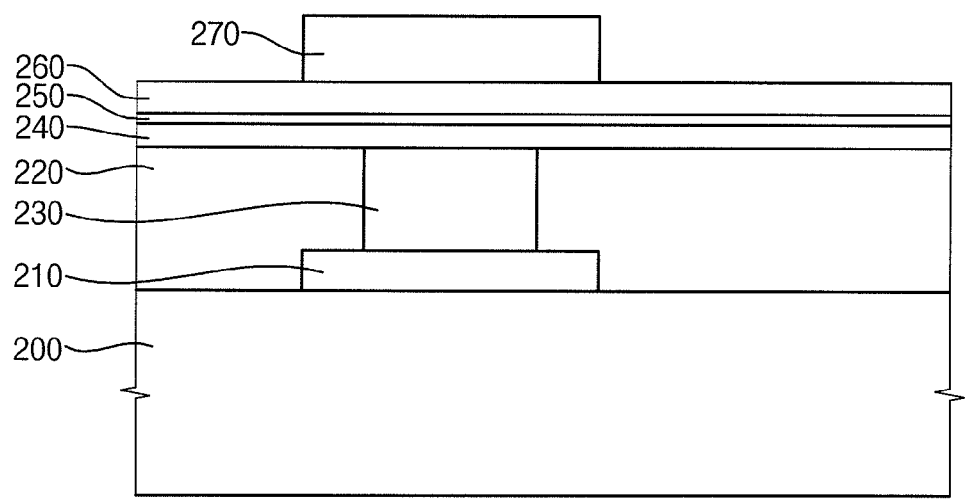

Referring to FIG. 17, a lower electrode layer 240 of a capacitor may be formed on the lower contact plug 230. A material of the lower electrode layer 240 may be, for example, TiN, Ti, TaN, Pt, etc. A dielectric layer 250 of a capacitor may be formed on the lower electrode 240. The dielectric layer 250 may be formed by the above-mentioned methods of forming a zirconium carbo-oxynitride layer according to example embodiments. For example, the dielectric layer 250 may be formed by the process for forming the dielectric layer 190 as illustrated with reference to FIG. 14.

An upper electrode layer 260 may be formed on the dielectric layer 250. The upper electrode layer 260 may be formed using a conductive material, e.g. TiN, Ti, TaN, Pt, etc. A dummy upper electrode 270 may be formed on the upper electrode layer 260. The dummy upper electrode 270 may protect an upper electrode during a subsequent etching process, and may provide a structure of readily connecting the upper electrode to an upper wiring.

Figure 18:
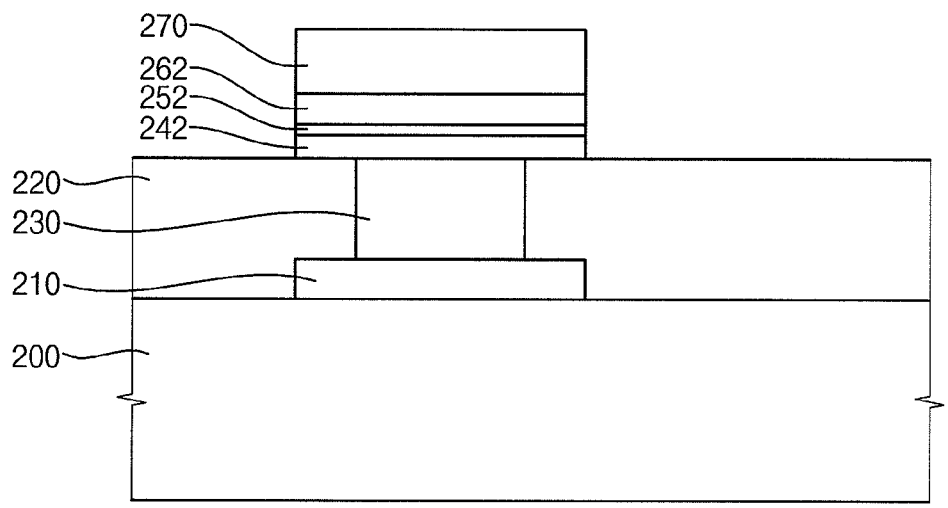

Referring to FIG. 18, the upper electrode layer 260, the dielectric layer and the lower electrode layer 240 may be sequentially patterned using the dummy upper electrode 270 to form a lower electrode 242, a dielectric layer pattern 252 and an upper electrode 262 on the lower contact plug 230.

Figure 19:
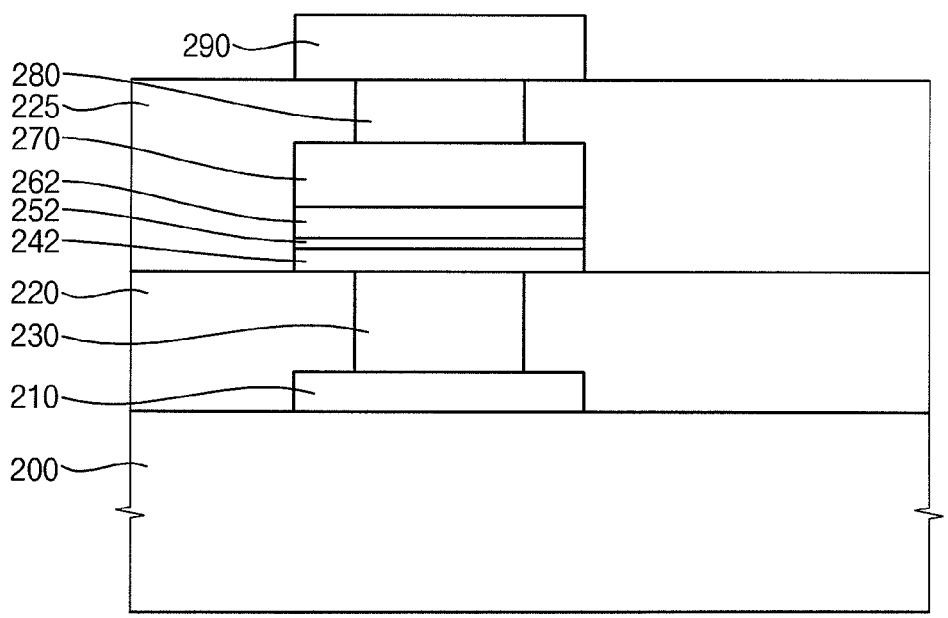

Referring to FIG. 19, a second insulating interlayer 225 may be formed on the first insulating interlayer 220 to cover the dummy upper electrode 270. A material of the second insulating interlayer 225 may be the same as or different from that of the first insulating interlayer 220. An upper contact hole may be formed in the second insulating interlayer 225 to expose the dummy upper electrode 270, and then an upper contact plug 280 may be formed in the upper contact hole. The upper contact plug 280 may make contact with the dummy upper electrode 270. An upper wiring 290 may be formed on the upper contact plug 280.

As mentioned above, a capacitor having a dielectric layer of zirconium carbo-oxynitride may be suitably employed in a logic device to reduce a leakage current through the dielectric layer.

FIGS. 20 through 23 are cross-sectional views illustrating a method of manufacturing a decoupling capacitor of a logic device according to example embodiments.

Figure 20:
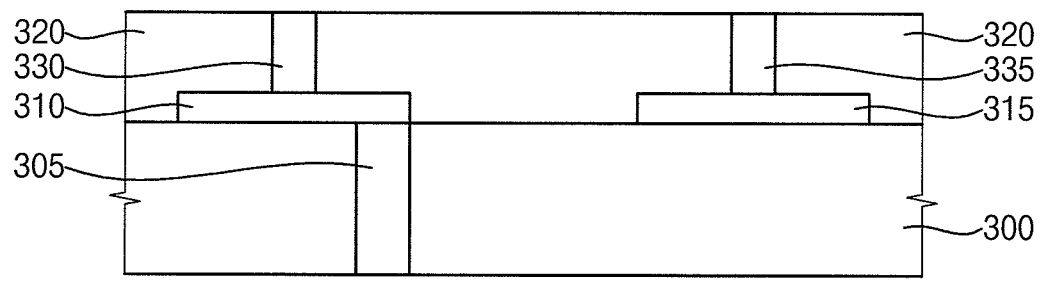

Referring to FIG. 20, a ground line 305 may be formed in or through a semiconductor substrate 300. First contact pads 310, 315 may be formed on the semiconductor substrate 300. The first contact pads 310, 315 may be connected with the ground line 305 or a power supply line. The first contact pads 310, 315 may be formed using a metal. A first insulating interlayer 320 may be formed on the semiconductor substrate 300 to cover the first contact pads 310, 315. The first insulating interlayer 320 may be formed using an insulation material, e.g. borophosphosilicate glass (BPSG), high density plasma chemical vapor deposition (HDP-CVD) oxide, etc. First contact holes may be formed in the first insulating interlayer 320 to expose the first contact pads 310, 315, and then first contact plugs 330, 335 may be formed in the first contact holes. The first contact plugs 330, 335 may be formed using a metal, e.g. copper (Cu), tungsten (W), etc.

Figure 21:
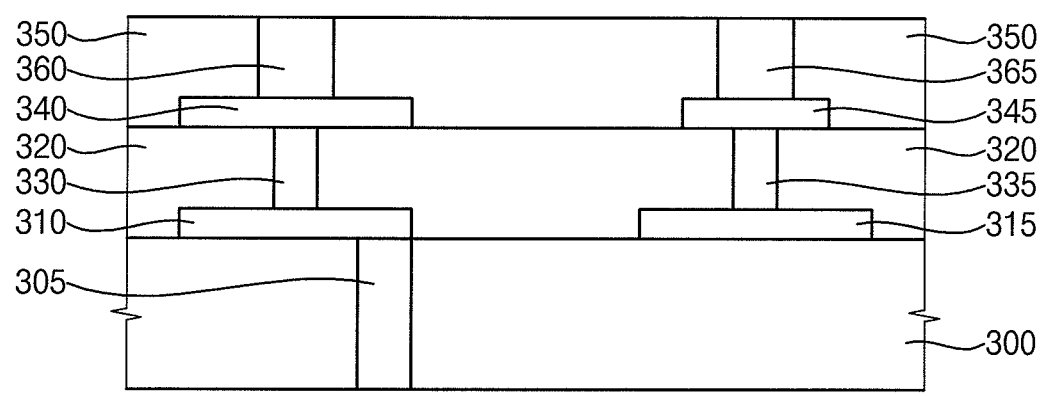

Referring to FIG. 21, second contact pads 340, 345, a second insulating interlayer 350 and second contact plugs 360, 365 may be formed on the first insulating interlayer 320. Formation of the second contact pads 340, 345, the second insulating interlayer 350 and the second contact plugs 360, 365 may be the same as or similar to the formation of the first contact pads 310, 315, the first insulating interlayer 320 and the first contact plugs 330, 335.

Figure 22:
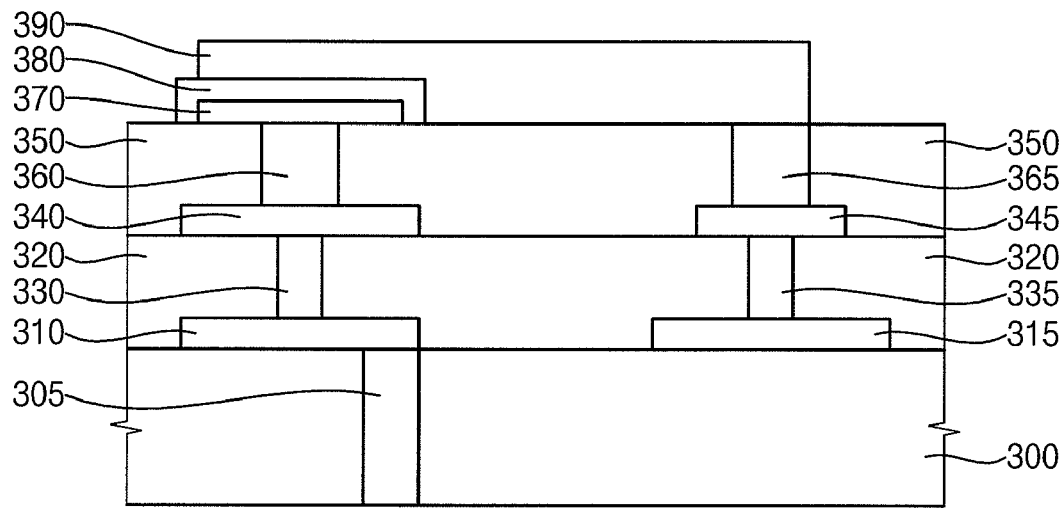

Referring to FIG. 22, a lower electrode 370 of a capacitor may be formed on the second contact plug 360 being electrically connected with the ground line 305. The lower electrode 370 may be formed using a conductive material, e.g. TiN, Ti, TaN, Pt, etc.

A dielectric layer 380 of a capacitor may be formed on the lower electrode 370. The dielectric layer 380 may be formed by the above-mentioned methods of forming a zirconium carbo-oxynitride layer according to example embodiments. For example, the dielectric layer 380 may be formed by the process for forming the dielectric layer 190 as illustrated with reference to FIG. 14.

An upper electrode 390 may be formed on the dielectric layer 380. The upper electrode 390 may be formed using a conductive material, e.g. TiN, Ti, TaN, Pt, etc. One portion of the upper electrode 390 may be formed on the dielectric layer, and another portion of the upper electrode 390 may be connected to the second contact plug 365 which may be electrically connected to the power supply line.

Figure 23:
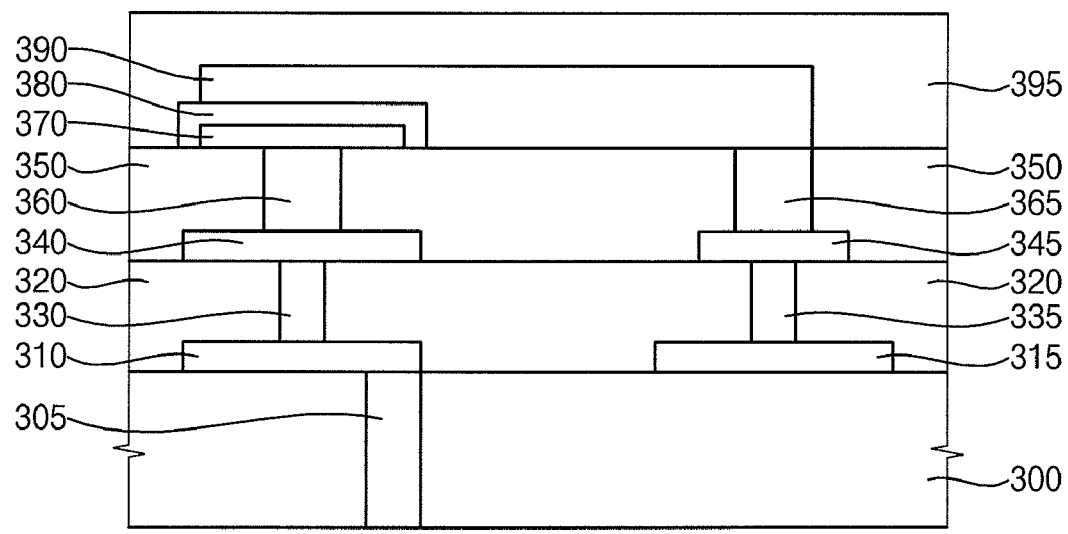

Referring to FIG. 23, a passivation layer 395 may be formed on the upper electrode 390. As a result, a decoupling capacitor which may have high capacitance to improve operational speed of a logic device may be manufactured.

FIGS. 24 through 28 are cross-sectional views illustrating a method of manufacturing a flash memory device according to example embodiments.

Figure 24:
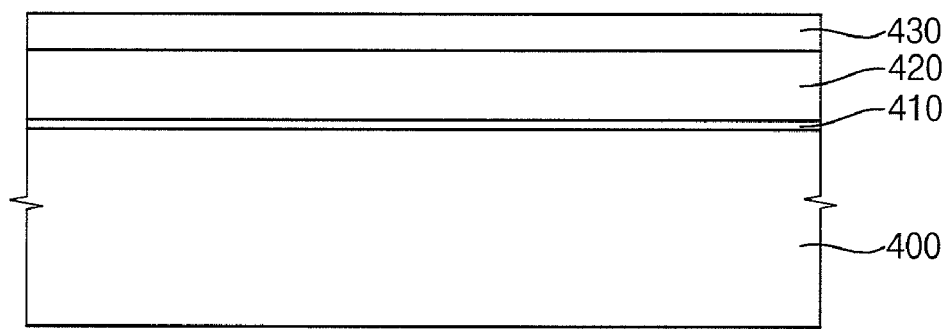

Referring to FIG. 24, a tunnel oxide layer 410, a floating gate electrode layer 420 and a hard mask layer 430 may be sequentially formed on a substrate 400. The substrate 400 may be a semiconductor substrate, e.g. a silicon wafer or a silicon on insulator (SOI) substrate.

The tunnel oxide layer 410 may be formed by, for example, a thermal oxidation process to have a thickness of about 50 Å to about 100 Å. The tunnel oxide layer 410 having high durability and uniformity may improve operational stability of reading or writing in a device. The tunnel oxide layer 410 having such properties may be formed using, for example, a radical oxidation method.

The floating gate electrode layer 420 may be formed by, for example, a CVD process using a conductive material, e.g. polysilicon or a metal. The floating gate electrode layer 420 may be formed to have a thickness of, for example, about 500 Å to about 1,500 Å. The floating gate electrode layer 420 may be a single layer formed by a single deposition, or the floating gate electrode layer 420 may be a multi-layer having at least two layers formed by a stepwise deposition in which a first layer may be formed with a relatively thin thickness (e.g. about 300 Å) and a second layer or an additional layer may be formed on the first layer. The floating gate electrode layer 420 having a multi-layer may improve characteristics of a device.

The hard mask layer 430 may be a single layer or a multi-layer. For example, the hard mask layer 430 may be obtained by forming a lower layer of oxide or nitride on the floating gate electrode layer 420, forming an organic layer on the lower layer, and then forming an anti-reflective layer of nitride on the organic layer.

Figure 25:
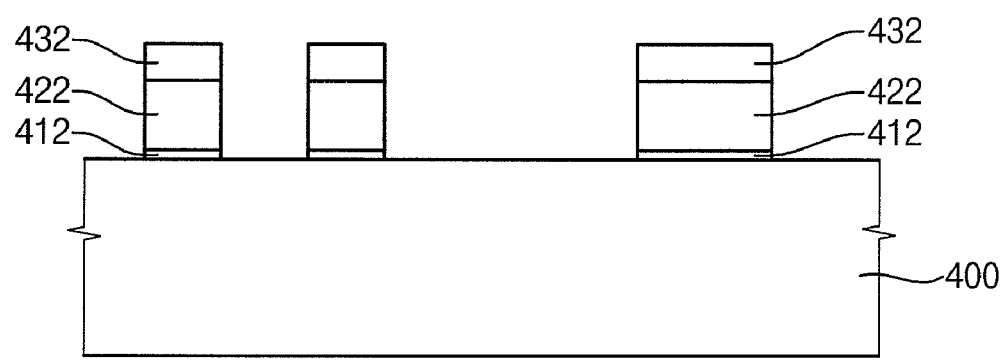

Referring to FIG. 25, the hard mask layer 430, the floating gate electrode layer 420 and the tunnel oxide layer 410 may be sequentially patterned by a photolithography process. For example, the hard mask layer 430 may be etched using, for example, a photoresist pattern as a mask, and then the floating gate electrode layer 420 and the tunnel oxide layer 410 may be etched using a hard mask layer pattern 432 as an etching mask to form a floating gate electrode 422 and a tunnel oxide layer pattern 412 on the substrate 400. By patterning the hard mask layer 430, the floating gate electrode layer 420 and the tunnel oxide layer 410, portions of the substrate 400 may be exposed. An isolation layer may be formed at the exposed portions of the substrate 400. The distance between the floating gate electrodes 422 formed in a memory cell region of the substrate 400 may be relatively narrow, and the distance between the floating gate electrodes 422 formed in a high voltage transistor region of the substrate 400 may be relatively wide.

Figure 26:
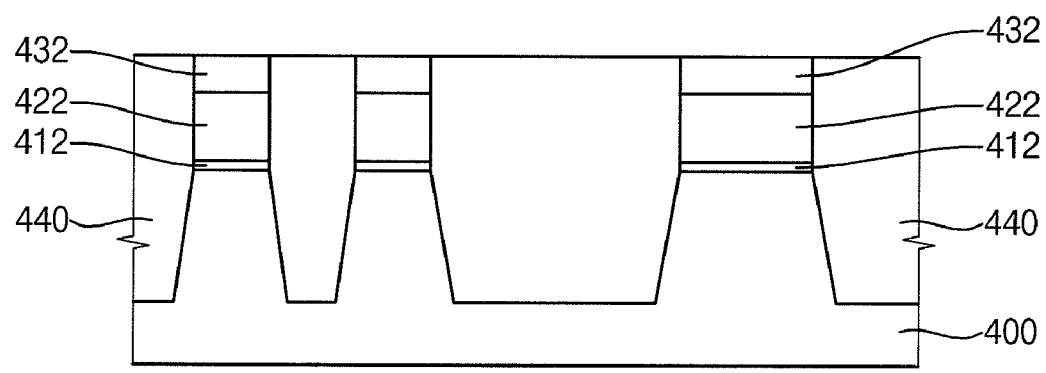

Referring to FIG. 26, a trench hole may be formed at the exposed portions of the substrate 400 using, for example, a floating gate electrode structure as a mask. The trench hole may be filled with an insulation material, and thus the trench hole may have a slope relative to the substrate 400 to reduce a concentration of stress to a channel of the device. The stress may be generated from the difference of the insulation material and the material of the substrate 400. An isolation layer 440 may be formed using, for example, a spin-on glass (SOG) material having polysilazane or an undoped silicate glass (USG) to reduce generation of a void.

Figure 27:
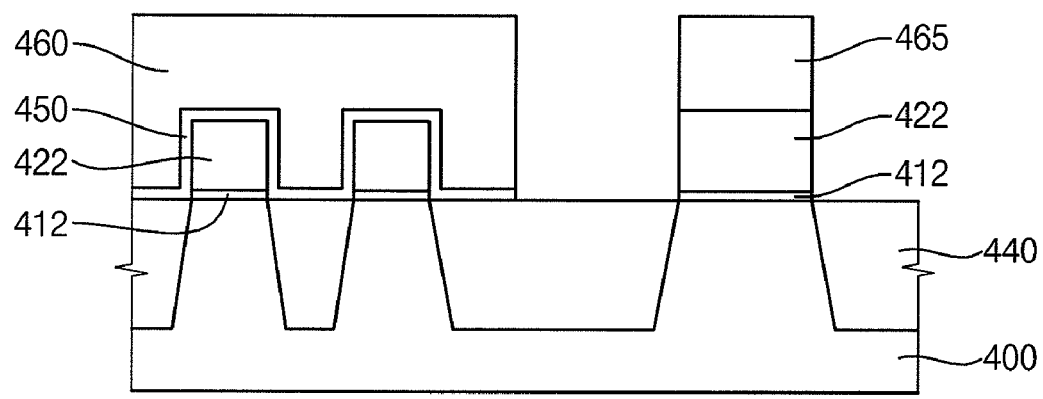

Referring to FIG. 27, an upper portion of the isolation layer 440 and the hard mask layer pattern 432 may be removed. A dielectric layer 450 may be formed on the floating gate electrode 422 and the isolation layer 440. The dielectric layer 450 may be formed using, for example, a high dielectric material to raise a coupling ratio. The dielectric layer 450 may be formed to have a thickness of e.g. about 100 Å to about 200 Å. For example, the dielectric layer 450 may be formed by the above-mentioned methods of forming a zirconium carbo-oxynitride layer according to example embodiments. For example, the dielectric layer 450 may be formed by the process for forming the dielectric layer 190 as illustrated with reference to FIG. 14.

A control gate electrode 460 may be formed on the dielectric layer 450 in the memory cell region. In the high voltage transistor region, the dielectric layer 450 may be removed from the floating gate electrode 422 and a control gate electrode 465 may be formed on the floating gate electrode 422, and thus a metal oxide semiconductor (MOS) transistor having two gate layers may be obtained.

Figure 28:
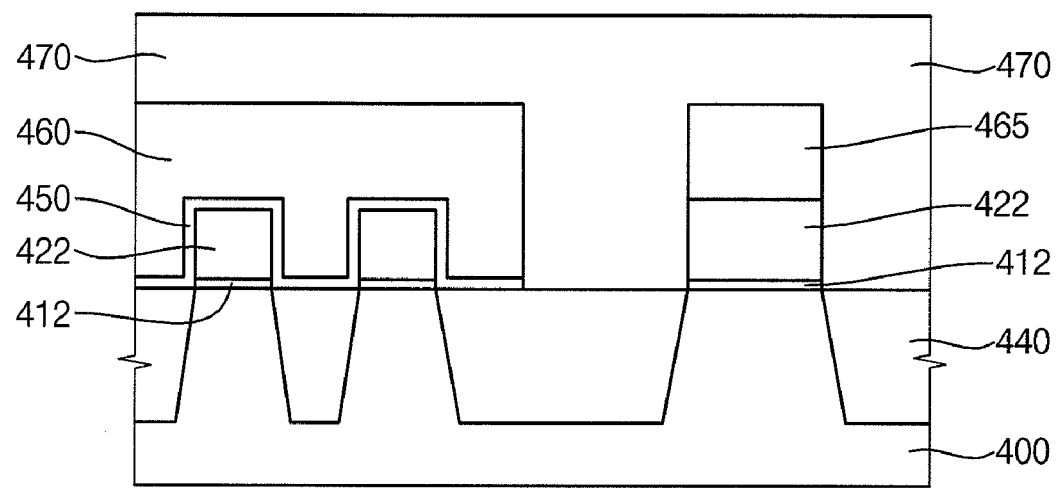

Referring to FIG. 28, an insulating interlayer 470 may be formed on the control gate electrode 460, 465. The insulating interlayer 470 may be formed to have a single layer or a multi-layer having at least two layers. The insulating interlayer 470 may be formed using an insulation material, e.g. an HDP-CVD oxide. As the integration degree of a device increases, a general CVD process may generate large voids while filling a hole, whereas an HDP-CVD process may reduce generation of a void because a fine chemical etching and a deposition may occur simultaneously. For example, the insulating interlayer 470 may be formed by firstly depositing an HDP-CVD oxide (e.g. to a thickness of about 2,000 Å), slightly wet-etching the deposited layer, and then secondly depositing an HDP-CVD oxide (e.g. to a thickness of about 6,000 Å or more).

Also, a contact hole may be formed in the insulating interlayer 470. A metal contact plug filling the contact hole and a metal line may be formed in or on the insulating interlayer 470. The metal line may be formed using a high conducive material, e.g. aluminum, tungsten or copper, as considering characteristics of a device.

Accordingly, a flash memory device having a dielectric layer of zirconium carbo-oxynitride layer may have a reduced leakage current and a high coupling ratio.

Figure 29:
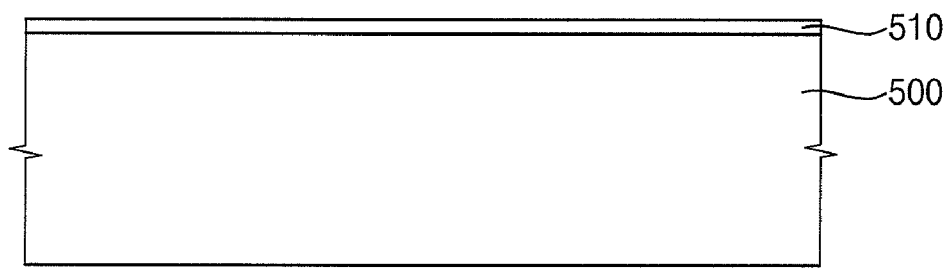
Figure 30:
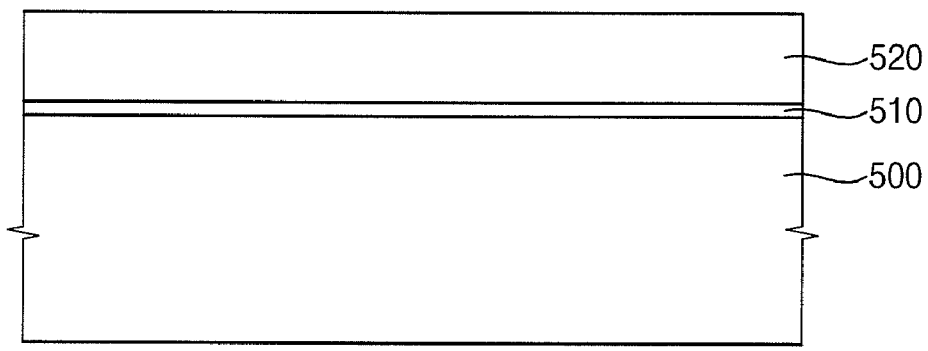
Figure 31:
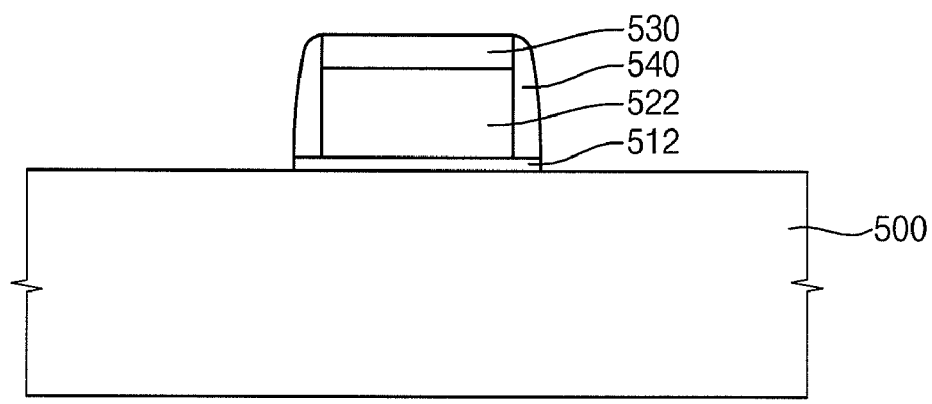

FIGS. 29 through 31 are cross-sectional views illustrating a method of manufacturing a gate structure according to example embodiments.

Referring to FIG. 29, a gate dielectric layer 510 may be formed on the substrate 500 using, for example, zirconium carbo-oxynitride. For example, the gate dielectric layer 510 may be formed by the above-mentioned methods of forming a zirconium carbo-oxynitride layer according to example embodiments. For example, the gate dielectric layer 510 may be formed by the process for forming the dielectric layer 190 as illustrated with reference to FIG. 14. The dielectric layer 510 formed by the method may have a high dielectric constant and a reduced leakage current, so the dielectric layer 510 may be usefully employed in a gate dielectric of a transistor.

Referring to FIG. 30, a gate electrode layer 520 may be formed on the gate dielectric layer 510. The gate electrode layer 520 may be formed using a conductive material, e.g. W, TiN, Ti, TaN, Pt, polysilicon, etc.

Referring to FIG. 31, a gate mask layer may be formed on the gate electrode layer 520, and then the gate mask layer may be patterned by, for example, a photolithography process to form a gate mask pattern 530. For example, gate electrode layer 520 and the gate dielectric layer 510 may be patterned using the gate mask pattern 530 as an etching mask to form a gate electrode 522 and a gate dielectric layer pattern 512 on the substrate 500. A gate spacer 540 may be formed on sidewalls of the gate electrode 522. Accordingly, a gate structure having enhanced characteristics may be obtained.

Figure 32:
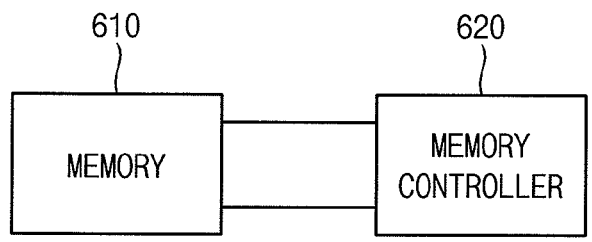
Figure 33:
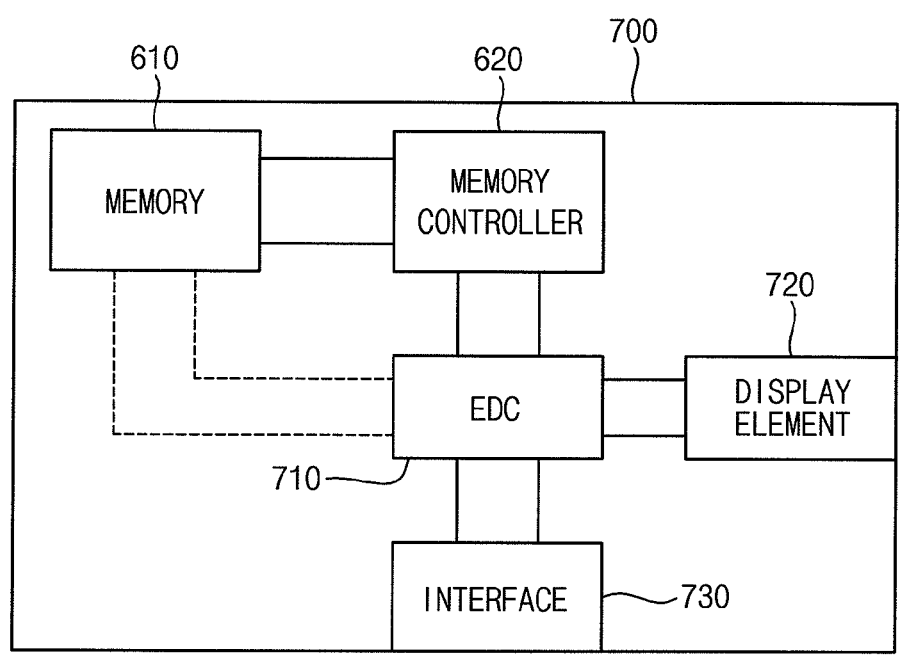
Figure 34:
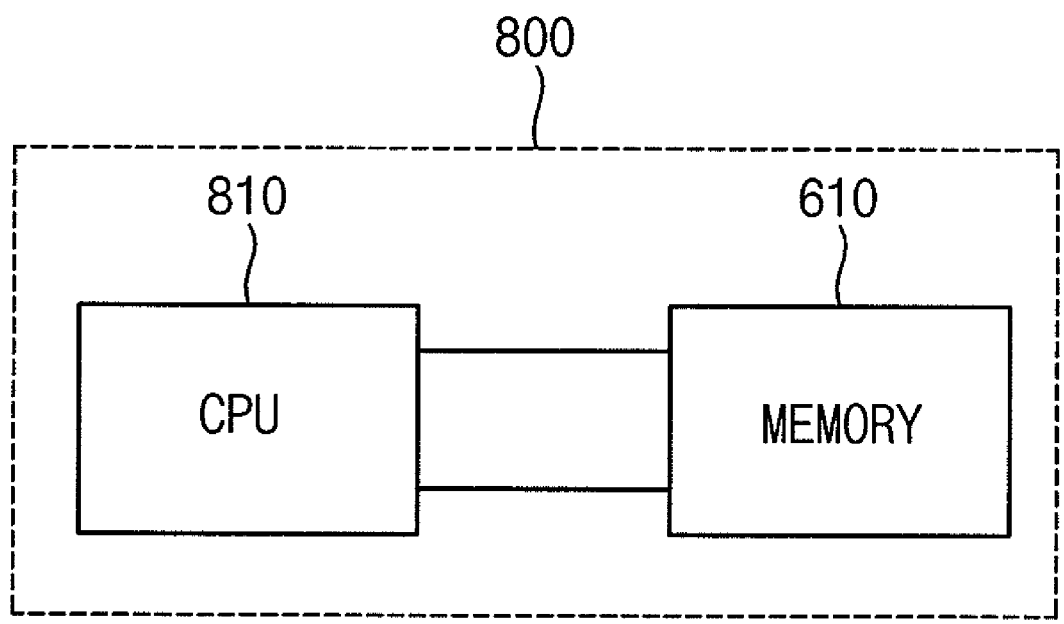

FIGS. 32 through 34 are block diagrams illustrating systems including a memory device in accordance with example embodiments.

Referring to FIG. 32, a memory controller 620 may be connected to a memory 610. The memory 610 may be a DRAM device having a dielectric layer of zirconium carbo-oxynitride in a capacitor or a flash memory device having a dielectric layer of zirconium carbo-oxynitride on a floating gate electrode, both which are illustrated above. The flash memory device may be, for example, an NAND flash memory or an NOR flash memory. The memory controller 620 may provide the memory 610 with input signals to control operations of the memory 610. In a memory card having the memory controller 620 and the memory 610, for example, the memory controller 620 may transfer commands of a host to the memory 610 to control input/output data and/or may control various data of a memory based on an applied control signal. Such a structure or a relation may be employed in various digital devices using a memory as well as the simple memory card. Further, the memory controller 620 may include, for example, the zirconium carbo-oxynitride layer as a dielectric layer of a capacitor or a gate of a transistor in a logic circuit.

Referring to FIG. 33, a portable device 700 may be provided according to example embodiments. The portable device 700 may include the memory 610 as being a DRAM device having a dielectric layer of zirconium carbo-oxynitride in a capacitor or a flash memory device having a dielectric layer of zirconium carbo-oxynitride on a floating gate electrode. Examples of the portable device 700 may include but are not limited to an MP3 player, a video player, a portable multi-media player (PMP), etc.

The portable device 700 may include the memory 610, the memory controller 620, an encoder/decoder (EDC) 710, a display element 720 and an interface 730. Data may be input to or output from the memory 610 by way of the memory controller 620. As illustrated in dot lines of FIG. 33, data may be directly input from the EDC 710 to the memory 610, or directly output from the memory 610 to the EDC 710.

The EDC 710 may encode data to be stored in the memory 610. For example, the EDC 710 may execute encoding for storing audio data and/or video data in the memory 610 of an MP3 player or a PMP player. Further, the EDC 710 may execute MPEG encoding for storing video data in the memory 610. The EDC 710 may include multiple encoders to encoding different types of data depending on their formats. For example, the EDC 710 may include an MP3 encoder for encoding audio data and an MPEG encoder for encoding video data.

The EDC 710 may decode data being output from in the memory 610. For example, the EDC 710 may execute MP3 decoding audio data from the memory 610. Further, the EDC 710 may execute MPEG decoding video data from the memory 610. The EDC 710 may include multiple decoders to encoding different types of data depending on their formats. For example, the EDC 710 may include an MP3 decoder for audio data and an MPEG decoder for video data.

The EDC 710 may include only a decoder. For example, encoded data may be input to the EDC 710, and then the EDC 710 may decode the input data to transfer into the memory controller 620 or the memory 610.

The EDC 710 may receive data to be encoded or data being encoded by way of the interface 730. The interface 730 may comply with established standards, e.g. FireWire, USB, etc. The interface 730 may include a FireWire interface, an USB interface, etc. Data may be output from the memory 610 by way of the interface 730.

The display element 720 may display to user data output from the memory 610 and decoded by the EDC 710. Examples of the display element 720 may include but are not limited to a speaker outputting audio data, a display screen outputting video data, etc.

Referring to FIG. 34, a computing system 900 may be provided according to example embodiments. The computing system 800 may include the memory 610 and a central processing unit (CPU) 810 connected to the memory 610. The memory 610 may be, for example, a DRAM device having a dielectric layer of zirconium carbo-oxynitride in a capacitor or a flash memory device having a dielectric layer of zirconium carbo-oxynitride on a floating gate electrode. An example of the computing system 800 may be a laptop computer including a flash memory as a main memory. Examples of the computing system 800 may include but are not limited to digital devices in which the memory 610 for storing data and controlling functions may be built. The memory 610 may be directly connected to the CPU 810, or indirectly connected to the CPU 810 by buses. Additionally, other elements or devices may be included in the computing system 800.

According to example embodiments, the zirconium carbo-oxynitride layer formed by sequentially providing the oxidizing gas and the nitriding gas to the adsorption layer of the zirconium source may have, for example, a stable structure in which zirconium, oxygen, carbon and nitrogen may be stably combined. The zirconium carbo-oxynitride layer may have a high temperature of crystallization relative to that of a zirconium oxide layer. Thus, the generation of a leakage current through a crystallized portion may be reduced or suppressed, and a device having a uniform threshold voltage along a channel length may be obtained. Further, the temperature margin of a thermal process performed after forming the zirconium carbo-oxynitride layer may be raised.

Furthermore, the zirconium carbo-oxynitride layer may have a reduced equivalent oxide thickness (EOT) and a high dielectric constant. Therefore, the dimension of a dielectric layer in a device may be reduced, and a highly-integrated device having an increased number of cells may be manufactured.

Additionally, the zirconium carbo-oxynitride layer may be formed to have sub-layers of various compositions by an ALD process using different process conditions. Such a zirconium carbo-oxynitride layer may not be readily crystallized during a thermal process due to non-uniformity of the compositions of the sub-layers, and thus the generation of a leakage current from the dielectric layer may also be reduced. Further, the dielectric constant of the dielectric layer may be simply adjusted by, for example, changing process conditions of each cycle in an ALD process. Therefore, the zirconium carbo-oxynitride layer may be properly employed in various devices or logics. The zirconium carbo-oxynitride layer may also be applied to a dielectric layer between a floating gate and a control gate in a flash memory device to improve a coupling ratio of the flash memory device.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor device, comprising:
   (a) providing a zirconium source having zirconium, carbon and nitrogen onto a semiconductor substrate to form an adsorption layer of the zirconium source on the semiconductor substrate;
   (b) performing a first purging process to remove a non-adsorbed portion of the zirconium source from the semiconductor substrate;
   (c) providing an oxidizing gas onto the adsorption layer of the zirconium source to form an oxidized adsorption layer of the zirconium source on the semiconductor substrate;
   (d) performing a second purging process to remove a non-reacted portion of the oxidizing gas;
   (e) providing a nitriding gas on the oxidized adsorption layer of the zirconium source to form a zirconium carbo-oxynitride layer on the semiconductor substrate; and
   (f) performing a third purging process to remove a non-reacted portion of the nitriding gas, wherein the steps from (a) through (f) are repeated in a cycle to form a dielectric layer of zirconium carbo-oxynitride on the semiconductor substrate, and wherein the dielectric layer is formed to have a plurality of atomic layers of zirconium carbo-oxynitride having a chemical formula of $ZrO_{2-x-y}C_xN_y$, in which x and y satisfy $0<x<2$, $0<y<2$ and $0<x+y<2$ and at least two of the atomic layers have different values for at least one of x and y from each other.

2. The method of claim 1, wherein the zirconium source includes tetrakis(dialkylamino)zirconium.

3. The method of claim 2, wherein the tetrakis(dialkylamino)zirconium compound is at least one of tetrakis(ethylmethylamino) zirconium ($Zr[N(CH_3)(CH_2CH_3)]_4$, TEMAZ), tetrakis(diethylamino) zirconium ($Zr[N(CH_2CH_3)2]_4$), and tetrakis (dimethylamino) zirconium($Zr[N(CH_3)2]_4$).

4. The method of claim 1, wherein the oxidizing gas includes at least one selected from oxygen ($O_2$), ozone ($O_3$) and water vapor ($H_2O$).

5. The method of claim 1, wherein the nitriding gas includes at least one selected from ammonia ($NH_3$), nitrous oxide ($N_2O$) and nitric oxide (NO).

6. The method of claim 1, wherein the nitriding gas is activated by plasma.

7. The method of claim 1, wherein at least two cycles are performed to form the dielectric layer of zirconium carbo-oxynitride having the plurality of atomic layers of zirconium carbo-oxynitride on the semiconductor substrate.

8. The method of claim 7, wherein the at least two cycles use at least one of different types, feed amounts and pressure levels for at least one of the oxidizing gas and the nitriding gas.

9. The method of claim 7, wherein the at least two cycles have a repeat unit including at least two cycles each of which uses at least one of different types, feed amounts and pressure levels for at least one of the oxidizing gas and the nitriding gas.

10. The method of claim 1, further comprising:
    forming a lower electrode on the semiconductor substrate before providing the zirconium source onto the semiconductor substrate; and
    forming an upper electrode on the zirconium carbo-oxynitride layer after performing the third purging process, and wherein the dielectric layer of zirconium carbo-oxynitride is formed on the lower electrode formed on the semiconductor substrate.

11. The method of claim 1, further comprising forming an electrode on the zirconium carbo-oxynitride layer after performing the third purging process.

12. The method of claim 1, further comprising:
    sequentially forming a tunnel oxide layer and a floating gate electrode on the semiconductor substrate before providing the zirconium source onto the semiconductor substrate; and
    forming a control gate electrode on the zirconium carbo-oxynitride layer after performing the third purging process,
    wherein the zirconium carbo-oxynitride layer is provided as a dielectric layer between the floating gate electrode and the control gate electrode.

13. A method of manufacturing a semiconductor device, comprising:
    (a) providing a zirconium source having zirconium, carbon and nitrogen onto a semiconductor substrate to form an adsorption layer of the zirconium source on the semiconductor substrate;
    (b) performing a first purging process to remove a non-adsorbed portion of the zirconium source from the semiconductor substrate;
    (c) providing an oxidizing gas onto the adsorption layer of the zirconium source to form an oxidized adsorption layer of the zirconium source on the semiconductor substrate;
    (d) performing a second purging process to remove a non-reacted portion of the oxidizing gas;
    (e) providing a nitriding gas on the oxidized adsorption layer of the zirconium source to form a zirconium carbo-oxynitride layer on the semiconductor substrate; and (f) performing a third purging process to remove a non-reacted portion of the nitriding gas, wherein the steps from (a) through (f) are repeated in a cycle to form a dielectric layer of zirconium carbo-oxynitride on the semiconductor substrate, and wherein the dielectric layer is formed to have a plurality of atomic layers of zirconium carbo-oxynitride having a chemical formula of $ZrO_{2-x-y}C_xN_y$ in which x and y satisfy $0<x<2$, $0<y<2$ and $0<x+y<2$, and the plurality of atomic layers has a repeating unit of at least two atomic layers which have different values for at least one of x and y.

14. The method of claim 10, further comprising forming an insulating interlayer and a metal wiring over the upper electrode.

15. The method of claim 10, wherein the lower electrode and the upper electrode are formed independently using at least one of the following materials selected from the group consisting of titanium nitride (TiN), Ti (titanium), tantalum nitride (TaN) and platinum (Pt).

16. The method of claim 13, further comprising:
forming a lower electrode on the semiconductor substrate before providing the zirconium source onto the semiconductor substrate; and
forming an upper electrode on the zirconium carbo-oxynitride layer after performing the third purging process, and wherein the dielectric layer of zirconium carbo-oxynitride is formed on the lower electrode formed on the semiconductor substrate.

* * * * *